(12) United States Patent
Sahoda et al.

(10) Patent No.: US 9,214,372 B2
(45) Date of Patent: Dec. 15, 2015

(54) SUBSTRATE PROCESSING SYSTEM, CARRYING DEVICE AND COATING DEVICE

(75) Inventors: Tsutomu Sahoda, Kawasaki (JP); Futoshi Shimai, Kawasaki (JP); Akihiko Sato, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 717 days.

(21) Appl. No.: 12/547,270

(22) Filed: Aug. 25, 2009

(65) Prior Publication Data

US 2010/0050940 A1 Mar. 4, 2010

(30) Foreign Application Priority Data

| Aug. 28, 2008 | (JP) | 2008-219561 |
| Aug. 28, 2008 | (JP) | 2008-219562 |
| Aug. 28, 2008 | (JP) | 2008-219563 |
| Jun. 16, 2009 | (JP) | 2009-143632 |

(51) Int. Cl.
*B05C 13/02* (2006.01)
*H01L 21/677* (2006.01)
*H01L 21/67* (2006.01)

(52) U.S. Cl.
CPC .... *H01L 21/67778* (2013.01); *H01L 21/67051* (2013.01); *H01L 21/67161* (2013.01); *H01L 21/67724* (2013.01); *H01L 21/67733* (2013.01);
(Continued)

(58) Field of Classification Search
CPC ............ H01L 21/677; H01L 21/67763; H01L 21/67706; H01L 21/67173; H01L 21/67736; H01L 21/6773; B65G 2201/0297; B65G 15/12; B65G 49/00; B65G 47/34; B65G 47/52; B65G 47/74; B65G 47/261; C23C 14/50; G03F 7/7075; Y10S 414/135; G01R 31/2893; B05C 13/00
USPC ............... 134/61, 66; 204/298.25; 198/465.1; 414/217, 939, 222.01, 225.01, 152; 118/719, 729; 396/611; 156/345.1
See application file for complete search history.

(56) References Cited

U.S. PATENT DOCUMENTS 3,648,819 A * 3/1972 Converse et al. .......... 198/346.1
4,722,653 A * 2/1988 Williams et al. ......... 414/222.13
(Continued)

FOREIGN PATENT DOCUMENTS

CN 1736831 A 2/2006
CN 101048861 A 10/2007
(Continued)

OTHER PUBLICATIONS

Office Action in U.S. Appl. No. 12/877,881, mailed Jun. 20, 2014.
(Continued)

*Primary Examiner* — Karl Kurple
(74) *Attorney, Agent, or Firm* — Knobbe, Martens, Olson & Bear, LLP

(57) ABSTRACT

A substrate processing system includes a processing unit, a substrate loading unit, a substrate unloading unit, and a carrying unit. A carrying device has a constitution in which a suction portion suctioning and holding a substrate is rotatable about an arm portion provided in a base portion and the substrate is rotated in the state where the substrate is held by a holding portion. A coating device has a constitution in which a liquid material is ejected from a nozzle to both surfaces of the substrate rotating in an upright state.

13 Claims, 14 Drawing Sheets

(52) U.S. Cl.
CPC .... *H01L 21/67736* (2013.01); *H01L 21/67742* (2013.01); *H01L 21/67766* (2013.01); *B05C 13/02* (2013.01); *H01L 21/67196* (2013.01); *H01L 21/67751* (2013.01)

(56) References Cited

U.S. PATENT DOCUMENTS

| | | | | |
|---|---|---|---|---|
| 4,884,330 | A * | 12/1989 | Sticht | 29/430 |
| 4,985,722 | A * | 1/1991 | Ushijima et al. | 396/624 |
| 5,544,421 | A * | 8/1996 | Thompson et al. | 34/58 |
| 5,603,777 | A * | 2/1997 | Ohashi | 134/25.4 |
| 5,626,675 | A | 5/1997 | Sakamoto et al. | |
| 5,700,127 | A * | 12/1997 | Harada et al. | 414/416.08 |
| 5,915,396 | A * | 6/1999 | Kinose | 134/61 |
| 6,053,977 | A | 4/2000 | Konishi | |
| 6,183,186 | B1 * | 2/2001 | Howells et al. | 414/416.03 |
| 6,184,972 | B1 | 2/2001 | Mizutani et al. | |
| 6,235,634 | B1 * | 5/2001 | White et al. | 438/680 |
| 6,241,825 | B1 | 6/2001 | Wytman | |
| 6,389,677 | B1 | 5/2002 | Lenz | |
| 6,435,330 | B1 * | 8/2002 | Bonora et al. | 198/346.3 |
| 6,439,559 | B1 | 8/2002 | Kinnard et al. | |
| 6,517,691 | B1 * | 2/2003 | Bluck et al. | 204/298.25 |
| 6,537,143 | B1 | 3/2003 | Yang et al. | |
| 6,572,462 | B1 | 6/2003 | Vanell | |
| 6,594,546 | B2 * | 7/2003 | Elger | 700/225 |
| 6,641,350 | B2 | 11/2003 | Nakashima et al. | |
| 6,648,124 | B1 * | 11/2003 | Garvey | 198/418.6 |
| 6,746,197 | B2 * | 6/2004 | Kimura et al. | 414/217 |
| 6,840,846 | B2 | 1/2005 | Boo et al. | |
| 6,860,801 | B2 | 3/2005 | Yang et al. | |
| 6,910,568 | B1 * | 6/2005 | Ydoate et al. | 198/370.07 |
| 6,939,202 | B2 | 9/2005 | Heidrich et al. | |
| 7,101,138 | B2 * | 9/2006 | Fosnight et al. | 414/222.11 |
| 7,114,904 | B2 * | 10/2006 | Charbonneau et al. | 414/276 |
| 7,413,069 | B2 | 8/2008 | Brill et al. | |
| 7,472,788 | B2 | 1/2009 | Bonora et al. | |
| RE43,023 | E | 12/2011 | Nakashima et al. | |
| 8,738,174 | B2 * | 5/2014 | You et al. | 700/218 |
| 8,992,153 | B2 * | 3/2015 | Scollay et al. | 414/217 |
| 2001/0038783 | A1 | 11/2001 | Nakashima et al. | |
| 2002/0025244 | A1 * | 2/2002 | Kim | 414/217 |
| 2002/0162728 | A1 * | 11/2002 | Hirasawa | 198/465.1 |
| 2004/0117055 | A1 * | 6/2004 | Seidel et al. | 700/121 |
| 2005/0115830 | A1 * | 6/2005 | Furukawa et al. | 204/298.25 |
| 2005/0245101 | A1 | 11/2005 | Brill et al. | |
| 2006/0099054 | A1 * | 5/2006 | Friedman et al. | 414/217 |
| 2006/0267262 | A1 | 11/2006 | Schiavi et al. | |
| 2007/0010908 | A1 | 1/2007 | Bonora et al. | |
| 2007/0065581 | A1 * | 3/2007 | Shiraiwa | 427/255.5 |
| 2007/0128007 | A1 * | 6/2007 | Bonora et al. | 414/217 |
| 2007/0186850 | A1 * | 8/2007 | Matsuoka et al. | 118/719 |
| 2007/0218812 | A1 | 9/2007 | Benvegnu et al. | |
| 2008/0023049 | A1 * | 1/2008 | Matsumoto et al. | 134/61 |
| 2008/0101912 | A1 * | 5/2008 | Martin et al. | 414/935 |
| 2009/0000908 | A1 * | 1/2009 | Brain et al. | 198/349.6 |
| 2009/0024244 | A1 * | 1/2009 | Harris et al. | 700/121 |
| 2009/0139833 | A1 * | 6/2009 | Ogura et al. | 198/358 |
| 2010/0047045 | A1 * | 2/2010 | Park et al. | 414/222.07 |
| 2010/0172721 | A1 * | 7/2010 | Gilchrist et al. | 414/217 |
| 2010/0297353 | A1 * | 11/2010 | Sahoda et al. | 427/337 |
| 2010/0326354 | A1 | 12/2010 | Sahoda et al. | |
| 2011/0000428 | A1 * | 1/2011 | Sahoda et al. | 118/313 |
| 2011/0008534 | A1 * | 1/2011 | Sahoda et al. | 427/209 |
| 2013/0058743 | A1 * | 3/2013 | Rebstock | 414/281 |

FOREIGN PATENT DOCUMENTS

| | | |
|---|---|---|
| CN | 101218157 A | 7/2008 |
| JP | A-61-153174 | 7/1986 |
| JP | 62-001890 | 1/1987 |
| JP | A-64-059919 | 3/1989 |
| JP | A-04-119524 | 4/1992 |
| JP | A-06-082773 | 3/1994 |
| JP | A-06-310424 | 11/1994 |
| JP | H07-130642 | 5/1995 |
| JP | A-07-335717 | 12/1995 |
| JP | A-10-135300 | 5/1998 |
| JP | A-10-172946 | 6/1998 |
| JP | A-11-033468 | 2/1999 |
| JP | A-11-070354 | 3/1999 |
| JP | A-2000-012423 | 1/2000 |
| JP | A-2000-237669 | 9/2000 |
| JP | A-2002-064057 | 2/2002 |
| JP | A-2003-037043 | 2/2003 |
| JP | A-2003-218018 | 7/2003 |
| JP | A-2004-080053 | 3/2004 |
| JP | A-2004-237157 | 8/2004 |
| JP | A-2005-085913 | 3/2005 |
| JP | A-2008-182255 | 8/2008 |
| TW | 426886 B | 3/2001 |
| TW | 552655 B | 9/2003 |

OTHER PUBLICATIONS

Office Action issued on Apr. 8, 2013 for Chinese Patent Application No. 200910167447.7.
Office Action issued on Jun. 4, 2013 in Japanese Patent Application No. 2009-143632.
Office Action issued on Jul. 25, 2013 in U.S. Appl. No. 12/877,881.
Office Action issued on Dec. 18, 2012 for Japanese Patent Application No. 2008-219563.
Notice of Allowance issued on Feb. 19, 2012 for Japanese Patent Application No. 2008-219562.
Final Office Action mailed on Feb. 12, 2014 in U.S. Appl. No. 12/877,881.

* cited by examiner

SUBSTRATE PROCESSING SYSTEM, CARRYING DEVICE AND COATING DEVICE

BACKGROUND OF THE INVENTION

1. Field of the Invention

The present invention relates to a substrate processing system, a carrying device, and a coating device.

Priority is claimed on Japanese Patent Application No. 2008-219561, filed on Aug. 28, 2008, Japanese Patent Application No. 2008-219562, filed on Aug. 28, 2008, Japanese Patent Application No. 2008-219563, filed on Aug. 28, 2008, and Japanese Patent Application No. 2009-143632, filed on Jun. 16, 2009, the contents of which are incorporated herein by reference.

2. Description of the Related Art

For example, upon coating a thin film such as a resist film on various substrates such as a semiconductor substrate, a glass substrate forming a liquid crystal panel, and a substrate forming a hard disk, a coating device is used to form the coating film on the substrate while rotating the substrate (for example, see Patent Reference 1).

The coating device may be used as, for example, a coating unit mounted to a substrate processing system for performing a substrate loading operation, a substrate coating operation, and a substrate unloading operation.

The substrate processing system includes units for performing the main operations. For example, in the above-described example, a substrate loading unit for performing the loading operation and a substrate unloading unit for performing the unloading operation are mounted to the substrate processing system. In the case where the substrate is carried between plural units, in general, a carrying device is provided for each unit so as to deliver the substrate or a cassette accommodating the substrate between the carrying devices.

Next, the coating device is equipped with a rotary mechanism which rotates the substrate. The rotary mechanism is capable of rotating the substrate by absorbing and holding the substrate.

When the substrate is held by, for example, the rotary mechanism, in many cases, the substrate is carried by the carrying device from outside to the rotary mechanism. As the carrying device, a carrying device having a substrate holding portion provided in a front end of an arm, for example, is known. As the substrate holding portion provided in the carrying device, a substrate holding portion having an absorbing portion for absorbing the substrate, for example, is known. The carrying device carries the substrate up to the coating device, and delivers the substrate to the rotary mechanism of the coating device.

Next, in the coating device, in general, the substrate is laid down so as to be parallel to a horizontal plane and the substrate is rotated while the lower substrate surface is held.

Meanwhile, in the substrate used to form the hard disk, for example, it is necessary to coat the liquid material on both surfaces thereof In the case of this kind of substrate of which both surfaces are required to be coated with the liquid material, it is not possible to hold the lower substrate surface. For this reason, Patent Reference 1, for example, discloses a technology in which the substrate is rotated while the substrate is held by a holding piece.

[Patent Reference 1]

Japanese Unexamined Patent Application, First Publication No. Hei 7-130642

SUMMARY OF THE INVENTION

However, in the substrate processing system in which plural carrying devices are used for the carrying operation between the units, the constitution or control settings related to the arrangement of the carrying devices, the delivery control timing, and the like tend to be complicated. For this reason, a problem arises in that the overall system constitution is complicated and the process tact time is long.

In consideration of the above-described circumstance, a first object of the invention is to provide a substrate processing system capable of reducing the process tact time by simplifying the system constitution thereof.

Next, in the case where the substrate is delivered between the carrying device and the coating device, for example, a positioning operation of the substrate may be required or the substrate may be absorbed and held by the rotary mechanism again when an absorbing operation using the substrate holding portion is canceled. In this case, it takes time to perform such operations. For this reason, the process tact time required for one sheet of a substrate becomes long, and thus a problem arises in that it is difficult to improve throughput. This problem may arise in the case of performing other processes of rotating the substrate as well as in the case of forming a thin film on the substrate.

In consideration of the above-described circumstance, a second object of the invention is to provide a carrying device capable of improving throughput by reducing process tact time.

Next, according to the method disclosed in the Patent Reference 1, since the liquid material is coated on both surfaces of the substrate when the substrate is laid down, the coating conditions between the front and rear surfaces of the substrate are different. For this reason, the state of the thin film formed on the front surface of the substrate may be different from the state of the thin film formed on the rear surface thereof In consideration of the above-described circumstance, a third object of the invention is to provide a coating device capable of improving the state of the liquid material coated on the substrate.

According to a first aspect of the invention, there is provided a substrate processing system including: a processing unit which performs a predetermined process on a substrate; a substrate loading unit which supplies a loading container accommodating the substrate not subjected to the predetermined process and collects the empty loading container; a substrate unloading unit which collects an unloading container accommodating the substrate subjected to the predetermined process and supplies the empty unloading container; and a carrying unit which includes a carrying mechanism for carrying the loading container between the substrate loading unit and a loading position inside the processing unit and carrying the unloading container between the substrate unloading unit and an unloading position inside the processing unit.

According to this aspect, since the carrying mechanism provided in the carrying unit carries the loading container between the substrate loading unit and the loading position inside the processing unit and carries the unloading container between the substrate unloading unit and the unloading position inside the processing unit, the carrying operation in different carrying areas can be performed by one carrying mechanism. Accordingly, since the carrying process using the carrying mechanism can be unified, it is possible to simplify the system constitution, and to reduce the process tact time. In addition, according to this aspect, since the loading container and the unloading container are separately used, it is advantageous in that it is possible to prevent the substrate from being contaminated.

In the substrate processing system, the processing unit, the substrate loading unit, and the substrate unloading unit may be arranged in a linear direction.

In this case, since the processing unit, the substrate loading unit, and the substrate unloading unit are arranged in a linear direction, the carrying path between the units can be set in the linear direction. Accordingly, it is possible to prevent the carrying path from being complicated, and thus to simplify the system constitution.

In the substrate processing system, the processing unit may be disposed between the substrate loading unit and the substrate unloading unit.

In this case, since the processing unit is disposed between the substrate loading unit and the substrate unloading unit, the respective units are arranged in a direction along the stream of the substrate. Accordingly, it is possible to improve the efficiency of the process.

In the substrate processing system, the carrying unit may include a moving mechanism which moves the carrying mechanism in a linear direction.

In this case, since the carrying unit includes the moving mechanism which moves the carrying mechanism in a linear direction, it is possible to simplify the moving operation of the carrying mechanism. Accordingly, it is possible to simplify the system constitution.

In the substrate processing system, the substrate loading unit and the substrate unloading unit may be respectively provided with a plurality of container standby portions.

In this case, since the substrate loading unit and the substrate unloading unit are respectively provided with the plurality of container standby portions, it is possible to promptly process more substrates.

In the substrate processing system, at least one of the substrate loading unit and the substrate unloading unit may include a second moving mechanism which moves the plurality of container standby portions.

In this case, since at least one of the substrate loading unit and the substrate unloading unit includes the second moving mechanism which moves the plurality of container standby portions, it is possible to move the container standby portions closer to a the carrying unit. Accordingly, it is possible to promptly perform the carrying operation, and thus to improve the efficiency of the process.

In the substrate processing system, the second moving mechanism may move the container standby portions so that a supply target container moves closer to the carrying unit and a collection target container moves away from the carrying unit.

In this case, since the second moving mechanism moves the container standby portions so that the supply target container moves closer to the carrying unit and the collection target container moves away from the carrying unit, it is possible to further promptly perform the supply operation of the supply target container and the collection operation of the collection target container. Accordingly, it is possible to improve the efficiency of the process.

In the substrate processing system, the processing unit may be provided with a buffer mechanism which includes a plurality of second container standby portions corresponding to at least one of the loading position and the unloading position.

In this case, since the processing unit is provided with the buffer mechanism which includes the plurality of second container standby portions corresponding to at least one of the loading position and the unloading position, it is possible to promptly perform the loading operation and the unloading operation of the substrate in the processing unit. Accordingly, it is possible to improve the efficiency of the process.

In the substrate processing system, the buffer mechanism may include a third moving mechanism which moves the plurality of second container standby portions.

In this case, since the buffer mechanism includes the third moving mechanism which moves the plurality of second container standby portions, it is possible to move the second container standby portions in accordance with the number of the substrates remaining in the container. Accordingly, it is possible to improve the efficiency of the process.

In the substrate processing system, the third moving mechanism may move the second container standby portions in the same direction as the carrying mechanism.

In this case, since the third moving mechanism moves the second container standby portions in the same direction as the carrying mechanism, the second container standby portions move in the carrying direction. For this reason, the distance between the carrying mechanism and each second container standby portion is maintained to be uniform. Since the distance is maintained to be uniform, it is possible to uniformly perform the carrying operation between the carrying mechanism and each second container standby portion. Accordingly, it is possible to prevent the carrying operation from being complicated.

In the substrate processing system, the processing unit may include a pickup mechanism which lifts the substrate from the loading container and disposes the substrate at the loading position.

In this case, since the processing unit includes the pickup mechanism which lifts the substrate from the loading container and disposes the substrate at the loading position, it is possible to promptly perform the loading operation of the substrate.

In the substrate processing system, the carrying unit may include a rotary mechanism which rotates the orientation of the carrying mechanism.

In this case, since the carrying unit includes the rotary mechanism which rotates the direction of the carrying mechanism, even when the carrying direction is different from the direction of the container, it is possible to smoothly perform the carrying operation and the delivery operation.

In the substrate processing system, each of the loading container and the unloading container may be provided with an engagement portion, and the carrying mechanism may include a holding member which engages with the engagement portion so as to hold the loading container or the unloading container.

In this case, since each of the loading container and the unloading container is provided with the engagement portion, and the carrying mechanism includes the holding member which engages with the engagement portion so as to hold the loading container or the unloading container, it is possible to reliably hold the loading container and the unloading container.

The substrate processing system may further include a control device which controls a carrying position of at least one of the loading container and the unloading container in accordance with a processing state of the substrate in the processing unit.

In this case, since the carrying position of at least one of the loading container and the unloading container is controlled in accordance with the processing state of the substrate in the processing unit, it is possible to further efficiently perform the carrying operation.

In the substrate processing system, the predetermined process may include a coating process of coating a liquid material on the substrate, a pre-process of the coating process, and a post-process of the coating process.

In this case, since the predetermined process includes the coating process of coating the liquid material on the substrate, the pre-process of the coating process, and the post-process of the coating process, it is possible to simplify the system constitution in the steps before and after the coating process.

In the substrate processing system, the pre-process may include at least one of a process of irradiating ultraviolet ray to the substrate and a process of cleaning the substrate.

In this case, since the process is performed in a wide range such that the pre-process includes at least one of the process of irradiating ultraviolet ray to the substrate and the process of cleaning the substrate, it is possible to simplify the process system.

In the substrate processing system, the post-process may include at least one of a process of depressurizing the vicinity of the substrate and a process of heating the substrate.

In this case, since the process is performed in a wide range such that the post-process includes at least one of the process of depressurizing the vicinity of the substrate and the process of heating the substrate, it is possible to simplify the process system.

The substrate processing system may further include a foreign material detecting unit which detects a foreign material existing on the substrate subjected to the predetermined process.

When a foreign material is adhered to the substrate subjected to the predetermined process, the foreign material adhered portion of the substrate may be damaged in accordance with the next process. Accordingly, in this case, since the substrate processing system further includes the foreign material detecting unit which detects a foreign material existing on the substrate subjected to the predetermined process, it is possible to prevent the substrate attached with the foreign material from being used for the next process, and thus to prevent the substrate from being damaged.

According to a second aspect of the invention, there is provided a carrying device which carries a substrate between a substrate loading area, a substrate unloading area, and a substrate processing area, the carrying device including: an arm portion which is provided on a base portion; and a suction portion which is rotatably provided in the arm portion so as to suction and hold the substrate.

According to this aspect, since the suction portion is rotatably provided in the arm portion so as to suction and hold the substrate, it is possible to rotate the substrate while the substrate is held by the holding portion. For this reason, even when the substrate is rotated in the substrate processing area, it is not necessary to deliver the substrate to a rotary mechanism or the like. Since the operation of delivering the substrate is not performed, it is possible to promptly perform a process from the substrate carrying operation to the substrate processing operation. Accordingly, it is possible to reduce the process tact time, and thus to improve throughput.

In the carrying device, the substrate may be a substrate provided with an opening, and the suction portion may include a suction hole which suctions a surface of the substrate along the opening.

In this case, since the suction hole suctions the surface of the substrate along the opening when the substrate having the opening is processed, a wide area from the outer periphery of the substrate to the portion suctioned by the suction hole is set to a process target.

In the carrying device, the suction hole may be disposed so as to suction an unprocessed portion of the substrate.

In this case, since the suction hole is disposed so as to suction the unprocessed portion of the substrate, it is possible to suction the substrate without having an influence on the processed portion of the substrate.

In the carrying device, the suction portion may include a protrusion which is fitted into the opening.

In this case, since the suction portion includes the protrusion which is fitted into the opening, at least a part of the opening is blocked by the protrusion. Accordingly, upon suctioning the substrate, it is possible to suction the substrate without reducing the suctioning force even when the area including the opening is suctioned, and thus to further reliably hold the substrate.

In the carrying device, the protrusion may be provided so as to be separable from other portions of the suction portion.

In this case, since the protrusion is provided so as to be separable from other portions of the suction portion, for example, when the protrusion is not necessary, it is possible to separate the protrusion from other portions of the suction portion. In addition, since, for example, plural protrusions having different dimensions may be used for each case, it is possible to handle the case where the substrate provided with an opening having a different dimension is processed. Accordingly, it is possible to variously change the type of suctioning and holding of the substrate.

In the carrying device, a protrusion amount of the protrusion may be not more than the thickness of the substrate.

In this case, since the protrusion amount of the protrusion is not more than the thickness of the substrate, it is possible to prevent the protrusion from protruding to the opposite side of the absorbing surface of the substrate. Accordingly, it is easy to dispose other members on the opposite side of the absorbing surface of the substrate.

In the carrying device, the arm portion may be equipped with a driving portion which rotates the suction portion.

In this case, since the arm portion is equipped with the driving portion which rotates the suction portion, it is possible to further simplify the constitution of the device.

The carrying device may further include an external driving portion which rotates the substrate with the substrate interposed between itself and the suction portion.

In this case, since the substrate is rotated with the substrate interposed between the external driving portion and the suction portion, it is possible to rotate the substrate in the state where the substrate is held even when the driving mechanism is not provided in the arm portion. For this reason, since it is possible to realize a decrease in size of the arm portion and to simplify the constitution thereof, it is possible to minimize the load required for the carrying operation.

In the carrying device, the external driving portion may be provided in the substrate processing area.

In this case, since the external driving portion is provided in the substrate processing area, it is possible to perform the substrate processing operation and the substrate rotating operation in an interlocking manner. Accordingly, it is possible to improve the efficiency of the process.

In the carrying device, the external driving portion may include a pressing portion which presses the substrate, and the pressing portion may be formed so as to correspond to the suction portion.

In this case, since the external driving portion includes the pressing portion which presses the substrate, and the pressing portion is formed so as to correspond to the suction portion, a suctioning force is applied to the substrate using the suction portion and the pressing force using the pressing portion, where the suctioning force and the pressing force correspond to each other. Accordingly, it is possible to reliably hold the substrate.

In the carrying device, the arm portion may include a shaft portion which is rotatable about the base portion and is movable in a telescopic manner in a direction of a rotary axis of the rotation; and a telescopic portion which is provided in the shaft portion and is movable in a telescopic manner in a direction perpendicular to the direction of the rotary axis, and the suction portion may be provided in a front end of the telescopic portion.

In this case, since it is possible to rotate the arm portion about the base portion and to move the arm portion in a telescopic manner in the direction of the rotary axis of the rotation. Also, it is possible to move the arm portion in a telescopic manner in a direction perpendicular to the direction of the rotary axis. For this reason, it is possible to move the suction portion provided in the front end of the telescopic portion in a wide range.

In the carrying device, the external driving portion may include a pressing portion which presses the substrate, and the pressing portion may be formed so as to correspond to the suction portion.

In this case, since the external driving portion includes the pressing portion which presses the substrate, and the pressing portion is formed so as to correspond to the suction portion, it is possible to reliably hold the substrate by the pressing operation using the pressing portion and the suctioning operation using the suction portion.

In the carrying device, the external driving portion may allow the pressing portion to press the substrate when the substrate is disposed at a substrate processing position of the substrate processing area.

In this case, since the external driving portion allows the pressing portion to press the substrate when the substrate is disposed at the substrate processing position of the substrate processing area, it is possible to reliably hold the substrate from the time when the substrate is disposed.

The carrying device may further include a control portion which changes a suctioning state of the suction portion when the substrate is rotated by the external driving portion.

In this case, since the carrying device further includes the control portion which changes the suctioning state of the suction portion when the substrate is rotated by the external driving portion, it is possible to adjust the force of holding the substrate pressed by the pressing portion by controlling the suctioning state of the suction portion.

In the carrying device, the control portion may cancel the suctioning operation using the suction portion before the substrate is rotated by the external driving portion.

In this case, since the control portion cancels the suctioning operation using the suction portion before the substrate is rotated by the external driving portion, it is possible to efficiently perform the substrate rotating operation.

In the carrying device, the control portion may cancel the suctioning operation using the suction portion during the time when the substrate is rotated by the external driving portion.

In this case, since the control portion cancels the suctioning operation using the suction portion during the time when the substrate is rotated by the external driving portion, it is possible to efficiently perform the substrate rotating operation.

In the carrying device, the control portion may cancel the suctioning operation in accordance with the rotation state of the substrate.

In this case, since the control portion cancels the suctioning operation in accordance with the rotation state of the substrate, it is possible to perform a flexible control in accordance with the rotation state of the substrate.

In the carrying device, the control portion may cancel the suctioning operation using the suction portion after a predetermined process is performed on the substrate.

In this case, since the control portion cancels the suctioning operation using the suction portion after the predetermined process is performed on the substrate, it is possible to reliably hold the substrate during the predetermined process.

In the carrying device, the external driving portion may rotate the substrate even after the predetermined process.

In this case, since the external driving portion rotates the substrate even after the predetermined process, it is possible to prevent the substrate from suddenly stopping after the predetermined process.

According to a third aspect of the invention, there is provided a coating device including: a rotary mechanism which rotates a substrate in an upright state; and a coating mechanism which includes nozzles for ejecting a liquid material onto front and rear surfaces of the substrate while rotating the substrate.

According to this aspect, since it is possible to eject the liquid material from the nozzle to both surfaces of the substrate rotating in an upright state, it is possible to allow the liquid material coating conditions at the front and rear surfaces of the substrate to be more similar to each other. According to this aspect, since the liquid material is ejected from a position closer to the substrate so as to be coated on the front and rear surfaces of the substrate, it is possible to prevent a difference in the state of the thin film of the liquid material formed on the substrate. Accordingly, it is possible to improve the state of the liquid material coated on the substrate.

In the coating device, the rotary mechanism may rotate the substrate in the state where the substrate is upright at an angle equal to or more than 70° and equal to or less than 90° with respect to a horizontal plane.

In this case, since the rotary mechanism rotates the substrate in the state where the substrate is upright at an angle equal to or more than 70° and equal to or less than 90° with respect to a horizontal plane, it is possible to prevent a large difference between the front and rear surfaces of the substrate. Accordingly, it is possible to uniformly coat the liquid material on both surfaces of the substrate.

In the coating device, each nozzle may be configured to eject the liquid material from the center of the substrate to the outer periphery thereof.

In this case, since the nozzle is configured to eject the liquid material from the center of the substrate to the outer periphery thereof, the ejecting direction of the nozzle is equal to the direction of the centrifugal force acting on the substrate. Accordingly, it is possible to further reliably coat the liquid material on the substrate.

In the coating device, each nozzle may be bent from the center thereof to the outer periphery thereof.

In this case, since the nozzle is bent from the center thereof to the outer periphery thereof, it is possible to adjust the liquid material ejecting direction with a simple constitution without providing a separate adjusting mechanism for adjusting the liquid material ejecting direction.

In the coating device, an ejecting surface of a front end of each nozzle may be inclined with respect to a liquid material ejecting direction.

In this case, since the ejecting surface of the front end of the nozzle is inclined with respect to the liquid material ejecting direction, it is possible to reduce the surface tension of the liquid material at the front end of the nozzle.

Accordingly, since the liquid material smoothly stops upon stopping the coating operation using the liquid material, very little of the liquid material remains in the front end of the nozzle.

In the coating device, the nozzles may be provided below a rotary shaft of the rotary mechanism.

In this case, since the nozzle is provided below the rotary shaft of the rotary mechanism, the liquid material ejecting direction is equal to the direction of the gravity. Accordingly, the liquid material easily spreads on the substrate.

In the coating device, the nozzles may be disposed at the same positions on the front and rear surfaces of the substrate.

In this case, since the nozzles are disposed at the same positions on the front and rear surfaces of the substrate, it is possible for the coating conditions at the front and rear surfaces of the substrate to be equal to each other.

Accordingly, it is possible to uniformly coat the liquid material on both surfaces of the substrate.

In the coating device, the coating mechanism may include a moving mechanism which moves the nozzles.

In this case, since the coating mechanism includes the moving mechanism which moves the nozzles, it is possible to move the nozzles in accordance with the processing state of the device. Accordingly, it is possible to perform the process in a wider range.

The coating device may further include a nozzle managing mechanism which manages a nozzle state.

In this case, since the coating device further includes the nozzle managing mechanism which manages the nozzle state, it is possible to maintain the nozzle state to be uniform. Accordingly, it is possible to maintain the ejecting performance of the nozzle.

In the coating device, the nozzle managing mechanism may include a cleaning portion which cleans the front end of each nozzle by dipping the front end in a cleaning liquid.

In this case, since the nozzle managing mechanism includes the cleaning portion which cleans the front end of each nozzle by dipping the front end in the cleaning liquid, it is possible to clean and remove the liquid material adhered to the front end of the nozzle. When the liquid material is adhered to the front end of the nozzle, the nozzle may be blocked thereby deteriorating the ejecting performance. In the invention, it is possible to prevent the deterioration in the ejecting performance by cleaning the front end of the nozzle.

In the coating device, the nozzle managing mechanism may include a suction portion which suctions the front end of each nozzle.

In this case, since the nozzle managing mechanism includes the suction portion which suctions the front end of each nozzle, it is possible to remove the liquid material adhered to the front end of the nozzle or the cleaning liquid or the like used to clean the liquid material from the front end of the nozzle. Accordingly, it is possible to maintain the front end of the nozzle in a cleaner state.

In the coating device, the nozzle managing mechanism may include a liquid receiving portion which receives the liquid material preliminarily ejected from the nozzles.

In this case, since the nozzle managing mechanism includes the liquid receiving portion which receives the liquid material preliminarily ejected from the nozzles, it is easy to perform the preliminary liquid material ejecting operation. Accordingly, it is possible to prevent the deterioration in the ejecting performance of the nozzle.

The coating device may further include a cup portion which is disposed so as to surround a side portion of the substrate.

In this case, since the coating device further includes the cup portion which is disposed so as to surround the side portion of the substrate, it is possible to block the liquid material flying from the substrate due to the centrifugal force caused by the rotation of the substrate. Accordingly, it is possible to maintain the inner circumstance of the device in a clean state.

In the coating device, the cup portion may include an accommodation portion which accommodates the liquid material.

In this case, since the cup portion includes the accommodation portion which accommodates the liquid material, it is possible to collect the flying liquid material in the accommodation portion. Accordingly, it is possible to efficiently manage the flying liquid material.

In the coating device, a facing portion of the cup portion facing the side portion of the substrate may be provided so as to be separable from other portions of the cup portion.

In this case, since a facing portion of the cup portion facing the side portion of the substrate is provided so as to be separable from other portions of the cup portion, it is easy to perform the maintenance of the cup portion. Accordingly, it is easy to clean the cup portion.

In the coating device, the cup portion may include an adjusting mechanism which adjusts the dimensions of an opening of the facing portion.

In this case, since the cup portion includes the adjusting mechanism which adjusts the dimension of the opening of the facing portion, it is possible to flexibly handle the cases in which the coating process conditions such as the thickness of the substrate or the flying degree of the liquid material are different.

In the coating device, the cup portion may include an inner cup and an outer cup, and the inner cup may be provided with a second rotary mechanism which rotates the inner cup in a direction along the outer periphery of the substrate.

In this case, since the cup portion includes the inner cup and the outer cup, and the inner cup is provided with the second rotary mechanism which rotates the inner cup in a direction along the outer periphery of the substrate, it is possible to rotate only the inner cup without rotating the entire part of the cup portion.

In the coating device, the accommodation portion may include a discharging mechanism which discharges at least one of the liquid material and a gas inside the accommodation portion.

In this case, since the accommodation portion includes the discharging mechanism which discharges at least one of the liquid material and a gas inside the accommodation portion, it is possible to discharge the liquid material in the accommodation portion by using the discharging mechanism and to form a stream of the gas in the accommodation portion.

In the coating device, the cup portion may be formed in a circular shape, and the discharging mechanism may be provided in the tangential direction of the outer periphery of the cup portion.

In this case, since the cup portion is formed in a circular shape, and the discharging mechanism is provided in the tangential direction of the outer periphery of the cup portion, it is possible to discharge the liquid material along the rotation direction of the substrate.

In the coating device, the discharging mechanism may include a gas-liquid separating mechanism which is provided in a discharge path.

Since the discharging mechanism includes the gas-liquid separating mechanism which is provided in the discharge path, it is easy to handle the liquid material.

The coating device may further include a cleaning liquid nozzle which ejects a cleaning liquid of the cup portion to the substrate.

In this case, since the coating device further includes the cleaning liquid nozzle which ejects the cleaning liquid of the cup portion to the substrate, it is possible to allow the cleaning liquid ejected onto the substrate to fly into the cup portion by the rotation of the substrate. Accordingly, it is possible to efficiently clean the cup portion.

In the coating device, the nozzle may be used as the cleaning liquid nozzle.

In this case, since the nozzle is used as the cleaning liquid nozzle, it is possible to improve the efficiency of maintenance.

The coating device may further include an adjusting portion which adjusts a coating state of the outer periphery of the substrate.

In this case, since the coating device further includes the adjusting portion which adjusts the coating state of the outer periphery of the substrate, it is possible to improve the coating performance of the liquid material.

In the coating device, the adjusting portion may include a removing portion which removes the liquid material by dipping the outer periphery of the substrate in a solution.

In this case, since the adjusting portion includes the removing portion which removes the liquid material by dipping the outer periphery of the substrate in a solution, it is possible to efficiently remove the liquid material coated on the outer periphery.

In the coating device, the removing portion may include a solution nozzle which ejects the solution to the peripheral edge of the substrate.

In this case, since the removing portion includes the solution nozzle which ejects the solution to the peripheral edge of the substrate, it is possible to remove the periphery of the substrate using the solution nozzle without moving the position of the substrate. Accordingly, it is possible to improve the efficiency of the process of the substrate.

In the coating device, the solution nozzle may be capable of ejecting a cleaning liquid of the cup portion.

In this case, since the solution nozzle is capable of ejecting the cleaning liquid of the cup portion, the solution nozzle is capable of adjusting the coating state of the outer periphery of the substrate and cleaning the cup portion. Accordingly, since it is possible to perform the operations without providing a separate cup cleaning mechanism, it is possible to prevent the constitution of the device from being complicated.

In the coating device, the removing portion may include a control portion which ejects the solution from the solution nozzle at a position where the solution does not contact with the substrate and moves the solution nozzle to an ejecting position of the substrate in the state where the solution is ejected from the solution nozzle.

In this case, since the removing portion includes the control portion which ejects the solution from the solution nozzle at a position where the solution does not contact with the substrate and moves the solution nozzle to an ejecting position of the substrate in the state where the solution is ejected from the solution nozzle, it is possible to improve the precision of adjusting the coating state of the outer periphery of the substrate.

In the coating device, the adjusting portion may include a second suction portion which suctions the outer periphery of the substrate.

In this case, since the adjusting portion includes the second suction portion which suctions the outer periphery of the substrate, it is possible to promptly remove the liquid material or the solution adhered to the outer periphery of the substrate.

Effect of the Invention

According to the first aspect of the invention, it is possible to reduce the process tact time by simplifying the constitution of the substrate processing system.

According to the second aspect of the invention, since it is possible to reduce the process tact time of the carrying device, it is possible to improve the throughput.

According to the third aspect of the invention, it is possible to improve the state of the liquid material coated on the substrate.

DETAILED DESCRIPTION OF THE INVENTION

The exemplary embodiments of the invention will be described with reference to the accompanying drawings.

Figure 1:
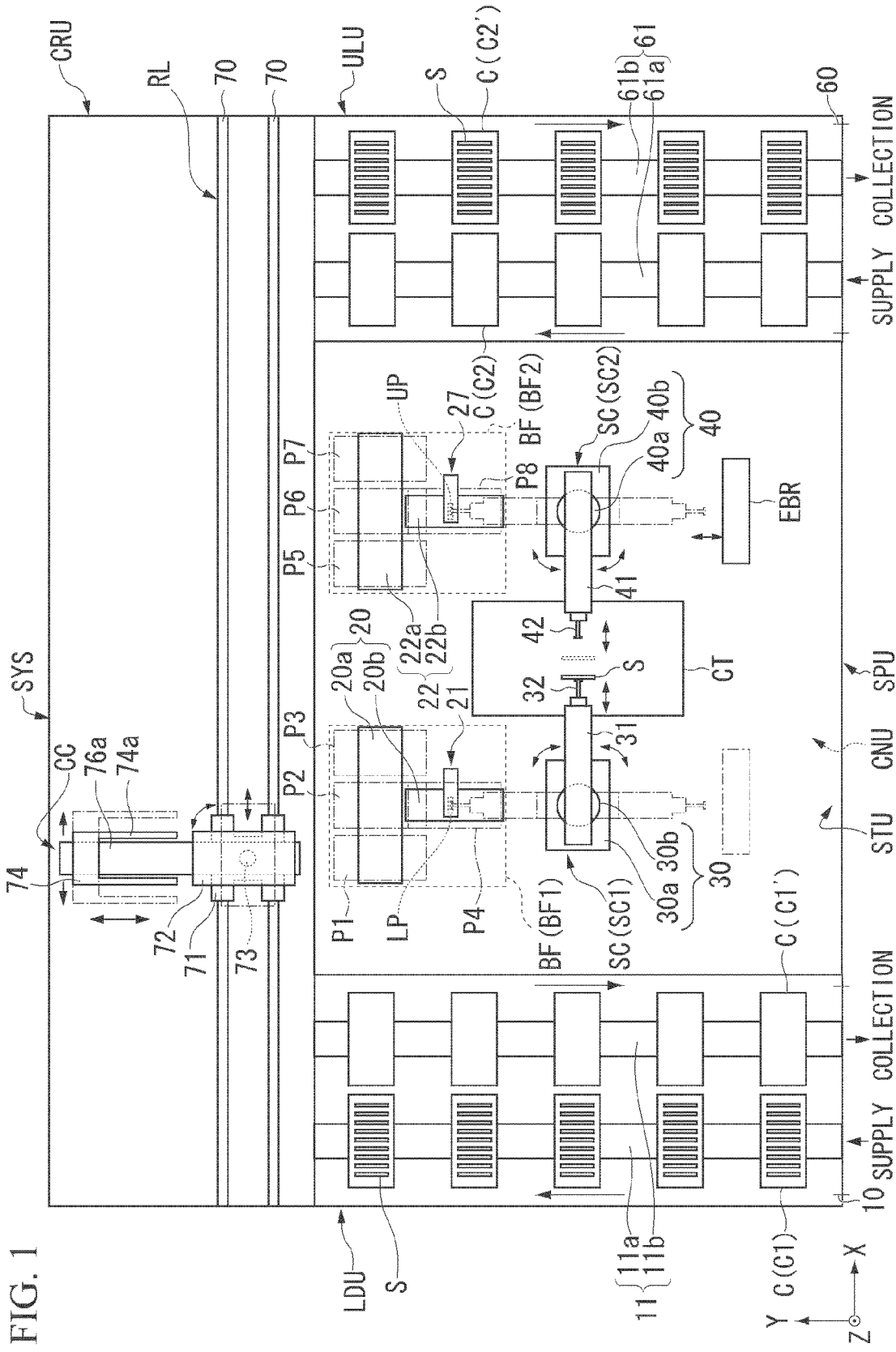
FIG. 1 is a plan view showing a constitution of a substrate processing system according to the embodiment of the invention.
Figure 2:
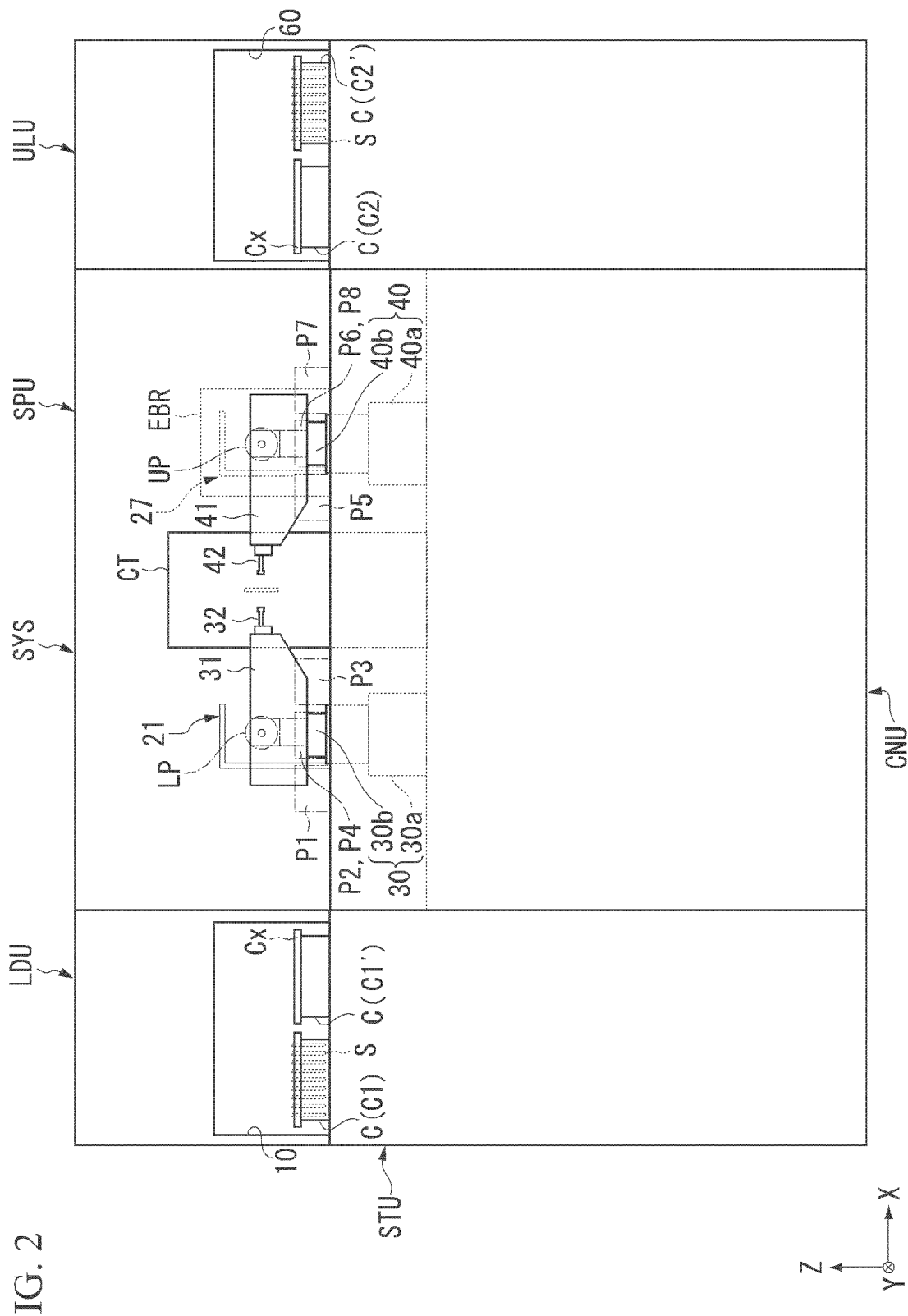
FIG. 2 is a front view showing the constitution of the substrate processing system according to the embodiment of the invention.
Figure 3:
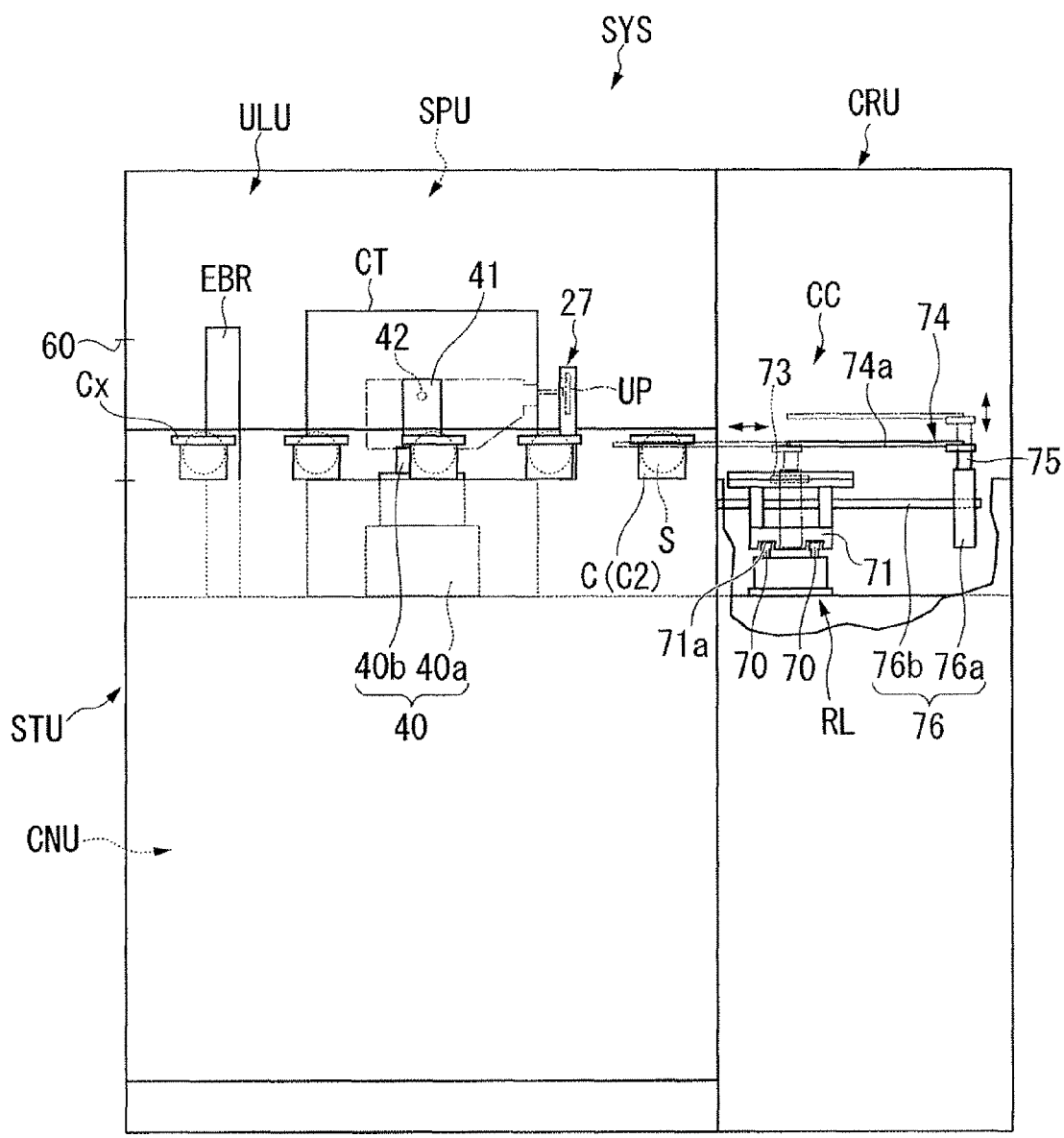
FIG. 3 is a side view showing the constitution of the substrate processing system according to the embodiment of the invention.

FIG. 1 is a plan view showing a schematic constitution of a substrate processing system SYS according to the embodiment of the invention. FIG. 2 is a front view showing the schematic constitution of the substrate processing system SYS. FIG. 3 is a side view showing the schematic constitution of the substrate processing system SYS.

In the embodiment, upon describing the constitution of the substrate processing system SYS, for the purpose of the simple markings, an XYZ coordinate system is used to describe the directions in the drawings. In the XYZ coordinate system, the horizontal direction in the drawing is marked as the X direction, and the direction perpendicular to the X direction in a plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

As shown in FIGS. 1 to 3, the substrate processing system SYS is a system which is incorporated into, for example, a manufacture line of a factory or the like and forms a thin film on a predetermined area of a substrate S. The substrate processing system SYS includes a stage unit STU, a substrate loading unit LDU, a substrate processing unit SPU, a substrate unloading unit ULU, a carrying unit CRU, and a control unit CNU.

The substrate processing system SYS, the stage unit STU is supported to a floor surface through, for example, a bridge member or the like. The substrate processing unit SPU, the substrate loading unit LDU, the substrate unloading unit ULU, and the carrying unit CRU are disposed on the upper surface of the stage unit STU. In the substrate processing unit SPU, the substrate loading unit LDU, the substrate unloading unit ULU, and the carrying unit CRU, each inside thereof is covered by a cover member. In the substrate processing system SYS, the substrate processing unit SPU, the substrate loading unit LDU, and the substrate unloading unit ULU are arranged in a linear shape along the X direction. The substrate processing unit SPU is disposed between the substrate loading unit LDU and the substrate unloading unit ULU. In a portion of the stage unit STU where the substrate processing unit SPU is disposed, a center thereof in a plan view is recessed in the −Z direction relative to other portions.

As the substrate S as a processing object of the substrate processing system SYS according to the embodiment, for example, a semiconductor substrate such as silicon, a glass substrate forming a liquid crystal panel, a substrate forming a hard disk, and the like may be exemplified. In the embodiment, as the substrate S, a substrate which forms a hard disk is an exemplary example. The substrate is formed of glass, and is formed as a disk-shaped base, of which a surface is coated with diamond and in which an opening (see FIGS. 12, 13, and the like) is formed at the center thereof in a plan view.

A loading operation and an unloading operation of the substrate S in the substrate processing system SYS according to the embodiment are performed by a cassette C capable of accommodating plural sheets of the substrates S. The cassette C is a container formed in a square shape, and is capable of accommodating plural sheets of substrates S in series so that the substrate surfaces face each other. Accordingly, the cassette C is configured to accommodate the substrates S in the state where the substrates S erect in the Z direction. The cassette C has an opening (see FIGS. 9 and 10) formed in a bottom portion thereof Each of the substrates S is accommodated so as to be exposed from the bottom portion of the cassette C through the opening. The cassette C is formed in a rectangular shape in a plan view, and has, for example, an engagement portion Cx formed in the +Z-direction-side edge portion as shown in FIG. 2. In the embodiment, as the cassette C, two types of cassettes, that is, a loading cassette C1 for loading the substrate S and an unloading cassette C2 for unloading the substrate S are used. The loading cassette C1 accommodates only the unprocessed substrate S, and the unloading cassette C2 accommodates only the processed substrate S. The loading cassette C1 is used between the substrate processing unit SPU and the substrate loading unit LDU. The unloading cassette C2 is used between the substrate processing unit SPU and the substrate unloading unit ULU. Accordingly, the loading cassette C1 and the unloading cassette C2 are not used together. The loading cassette C1 and the unloading cassette C2 are formed to have, for example, the same shape and size.

Substrate Loading Unit

The substrate loading unit LDU is disposed on the −X direction side of the substrate processing system SYS. The substrate loading unit LDU is a unit which receives the loading cassette C1 accommodating the unprocessed substrate S, and collects the empty loading cassette C1. The substrate loading unit LDU is elongated in the Y direction, and is capable of accommodating plural loading cassettes C1 arranged in the Y direction in a standby state.

The substrate loading unit LDU includes a cassette entrance 10 and a cassette moving mechanism (second moving mechanism) 11. The cassette entrance 10 is an opening which is provided in the −Y direction side of the cover member covering the substrate loading unit LDU. The cassette entrance 10 is an inlet (supply opening) for the loading cassette C1 accommodating the unprocessed substrates S, and an outlet (collection opening) for the empty cassette C1.

The cassette moving mechanism 11 includes, for example, a driving mechanism such as a belt conveyor mechanism. In the embodiment, as the driving mechanism, conveyor belts (a supply belt 11a and a collection belt 11b) are provided. The conveyor belts extend in the Y direction from the +Y-direction-side end portion of the substrate loading unit LDU to the −Y-direction-side end portion thereof, where two conveyor belts extend in the X direction.

Among two conveyor belts, the supply belt 11a is a conveyor belt which is disposed on the −X direction side. The +Z-direction-side surface of the supply belt 11a is used as a conveyor surface. The supply belt 11a is configured to rotate so that the conveyor surface moves in the +Y direction. Plural loading cassettes C1, which enter the substrate loading unit LDU through the cassette entrance 10, are placed on the conveyor surface of the supply belt 11a. The loading cassettes C1 are moved to the carrying unit CRU by rotation of the supply belt 11a.

Among two conveyor belts, the collection belt 11b is a conveyor belt which is disposed on the +X direction side. The +Z-direction-side surface of the collection belt 11b is used as a conveyor surface. The collection belt 11b is configured to rotate so that the conveyor surface moves in the −Y direction. Plural empty loading cassettes C1' are placed on the conveyor surface of the collection belt 11b. The loading cassettes C1' are made to move to the cassette entrance 10 by rotation of the collection belt 11b.

In the embodiment, for example, the loading cassettes C1 are capable of staying in a standby state at standby positions (container standby portion) provided at five positions on the supply belt 11a and the collection belt 11b. In the substrate loading unit LDU, it is possible to move the standby position of the loading cassette C1 by rotating the supply belt 11a and the collection belt 11b. It is possible to shorten the carrying time of the loading cassette C1 by moving the standby position.

Substrate Processing Unit

The substrate processing unit SPU is disposed on the +X direction side of the substrate loading unit LDU in the substrate processing system SYS so as to be substantially located at the center in the X direction. The substrate processing unit SPU is a unit which performs various processes such as a process of coating a liquid material such as resist on the substrate S so as to form a thin film thereon and a process of removing the thin film formed on the peripheral portion of the substrate S. The substrate processing unit SPU includes a coating device (a substrate processing area) CT, a peripheral edge removing device EBR, buffer mechanisms (a substrate loading area and a substrate unloading area) BF, and substrate carrying devices (carrying device) SC.

The coating device CT is substantially disposed at the center of the substrate processing unit SPU in a plan view, and is fixed to the upper surface of the recessed portion of the stage unit STU. The coating device CT is a device which coats a liquid material on the substrate S so as to form a thin film thereon. In the embodiment, the coating device CT forms a thin film, used to perform an imprinting process, on the substrate S. The coating device CT includes a nozzle (not shown) which ejects the liquid material as a material forming the thin film onto the substrate S. The access to the coating device CT is possible from both −X direction side and +X direction side of the coating device CT. Accordingly, for example, the loading operation and the unloading operation of the substrate S are possible from both −X direction side and the +X direction side. The coating device CT is configured to perform a coating process at a coating position (a position depicted by the dashed line in the drawing) substantially positioned in the center of the STU unit in the X direction.

The peripheral edge removing device EBR is provided at a position on the +X direction side of the coating device CT along the −Y-direction-side edge of the substrate processing unit SPU. The peripheral edge removing device EBR is a device which removes the thin film formed on the peripheral edge of the substrate S. It is desirable that a removing process using the peripheral edge removing device EBR is performed in a state where the thin film formed on the substrate S is not dried. For this reason, it is desirable that the peripheral edge removing device EBR is disposed at a position capable of carrying the substrate S from the coating device CT. The peripheral edge removing device EBR includes, for example, a dip portion (not shown) which dissolves and removes the thin film formed on the peripheral edge of the substrate S by rotating the substrate S in a state where the peripheral edge of the substrate S is dipped in a solution.

The buffer mechanisms BF are respectively provided at two positions along the +Y-direction-side edge of the substrate processing unit SPU with the coating device CT interposed therebetween in the X direction. Among the buffer mechanisms BF at two positions, the buffer mechanism disposed on the −X direction side of the coating device CT is a loading buffer mechanism (substrate loading area) BF1, and the buffer mechanism disposed on the +X direction side of the coating device CT is an unloading buffer mechanism (substrate unloading area) BF2.

The loading buffer mechanism BF1 is a portion where the loading cassette C1 supplied to the substrate processing unit SPU stays in a standby state. The loading buffer mechanism BF1 is provided with a cassette moving mechanism (third moving mechanism) 20. The cassette moving mechanism 20 includes, for example, a driving mechanism such as a conveyor mechanism. In the embodiment, as the driving mechanism, two conveyor belts 20a and 20b are provided.

The conveyor belt 20a is provided in an area in the X direction of the loading buffer mechanism BF1. The +Z-direction-side surface of the conveyor belt 20a is used as a conveyor surface, and the supplied loading cassette C1 is placed on the conveyor surface. The conveyor belt 20a is adapted to rotate so that the conveyor surface moves in X direction. It is possible to move the loading cassette C1 in the X direction of the loading buffer mechanism BF1 by rotating of the conveyor belt 20a. The conveyor belt 20b is provided at the center in the X direction of the loading buffer mechanism BF1. The +Z-direction-side surface of the conveyor belt 20b is used as a conveyor surface, and the loading cassette C1 is placed on the conveyor surface. The conveyor belt 20b is adapted to rotate so that the conveyor surface moves in the Y direction. By the rotation of the conveyor belt 20b, the loading cassette C1 moves in the Y direction. Likewise, the cassette moving mechanism 20 moves the standby position of the loading cassette C1.

In the loading buffer mechanism BF1, plural, for example, three loading cassettes C1 are arranged in the X direction of the formation area of the conveyor belt 20a so as to stay in a standby state (second container standby portion). The standby position P1 on the −X direction side of the drawing is, for example, a standby position for the loading cassette C1 supplied to the substrate processing unit SPU. The standby position P2 at the center in the X direction of the drawing is a standby position for the loading cassette C1 moving from the standby position P1. The standby position P3 on the +X direction side of the drawing is a standby position for the loading cassette C1 moving from the standby position P2.

The +Y-direction-side end portion of the conveyor belt 20b is disposed inside the standby position P2. For this reason, the loading cassette C1 disposed at the standby position P2 moves in the −Y direction side relative to the standby position P2 by the conveyor belt 20b, and stays at the standby position P4 in a standby state. A loading position LP for the substrate S is provided on the +Z direction side of the standby position P4. The substrate S is carried to the coating device CT through the loading position LP.

The unloading buffer mechanism BF2 is a portion of SPU where the unloading cassette C2 supplied to the substrate processing unit SPU stays in a standby state. The unloading buffer mechanism BF2 is provided with a cassette moving mechanism (third moving mechanism) 22. The cassette moving mechanism 22 includes, for example, a driving mechanism such as a belt conveyor. In the embodiment, as in the loading buffer mechanism BF1, two conveyor belts 22a and 22b are provided as the driving mechanism.

The conveyor belt 22a is provided in an area in the X direction of the unloading buffer mechanism BF2. The +Z-direction-side surface of the conveyor belt 22a is used as a conveyor surface, and the supplied unloading cassette C2 is placed on the conveyor surface. The conveyor belt 22a is adapted to rotate so that the conveyor surface moves in the X direction. It is possible to move the unloading cassette C2 in the X direction of the unloading buffer mechanism BF2 by rotating of the conveyor belt 22a. The conveyor belt 22b is provided at the center in the X direction of the unloading buffer mechanism BF2. As in the conveyor belt 20b, the +Z-direction-side surface of the conveyor belt 22b is used as a conveyor surface, and the unloading cassette C2 is placed on the conveyor surface. The conveyor belt 22b is adapted to rotate so that the conveyor surface moves in the Y direction. By the rotation of the conveyor belt 22b, the unloading cassette C2 moves in the Y direction. Thus, the cassette moving mechanism 22 moves the standby position of the unloading cassette C2.

In the unloading buffer mechanism BF2, multiple, for example, three, loading cassettes C2 are arranged in the X direction on the conveyor belt 22a so as to stay in a standby state (second container standby portion). The standby position P5 on the −X direction side of the drawing is, for example, a standby position for the unloading cassette C2 supplied to the substrate processing unit SPU. The standby position P6 at the center in the X direction of the drawing is a standby position for the unloading cassette C2 moving from the standby position P5. The standby position P7 on the +X direction side of the drawing is a standby position for the unloading cassette C2 moving from the standby position P6.

The +Y-direction-side end portion of the conveyor belt 22b is disposed inside the standby position P6. For this reason, the unloading cassette C2 disposed at the standby position P6 moves in the −Y direction side relative to the standby position P6 by the conveyor belt 22b, and stays at the standby position P8 in a standby state. An unloading position UP for the substrate S is provided on the +Z direction side of the standby position P8. The substrate S is carried from the coating device CT to the unloading cassette C2 through the unloading position UP.

The substrate carrying devices SC are provided at two positions with the coating device CT interposed therebetween in the X direction so as to be located at the center in the Y direction of the substrate processing unit SPU. Among the substrate carrying devices SC at two positions, a device disposed on the −X direction side of the coating device CT is a loading carrying device SC 1, and a device disposed on the +X direction side of the coating device CT is an unloading carrying device SC2. The loading carrying device SC1, the unloading carrying device SC2, and the coating device CT are arranged in a linear shape in the X direction.

Figure 4:
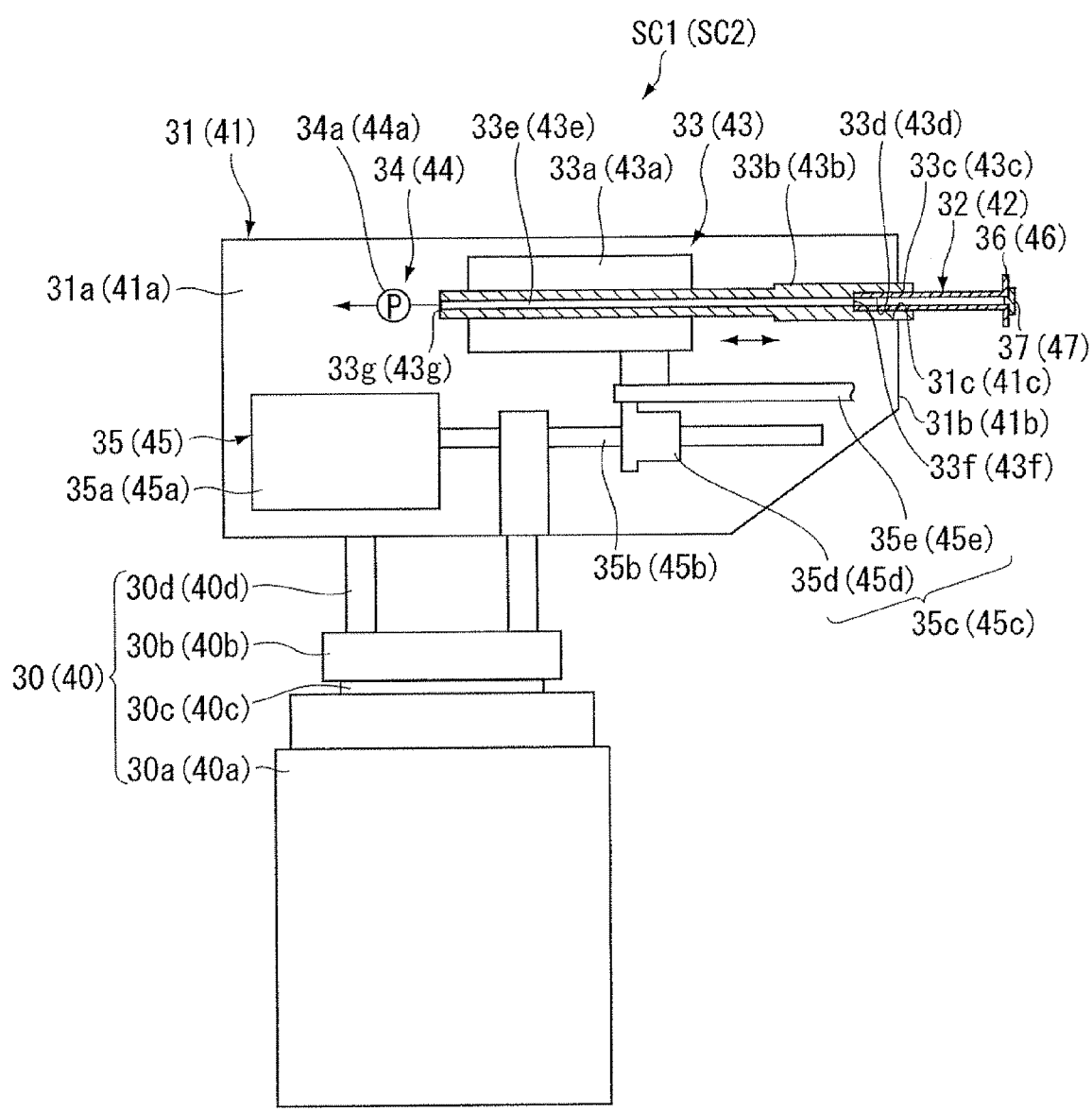
FIG. 4 is a view showing a constitution of a substrate carrying device.

The loading carrying device SC1 accesses the coating device CT and the loading position LP of the loading buffer mechanism BF1 so as to carry the substrate S therebetween. FIG. 4 is a schematic view showing a constitution of the loading carrying device. As shown in FIGS. 1 to 4, the loading carrying device SC1 includes a base portion 30, an arm portion 31, and a holding portion (suction portion) 32.

The base portion 30 is provided on the upper surface of the recessed portion of the stage unit STU. The base 30 includes a fixed table 30a, a rotary table 30b, a rotary mechanism 30c, and support members 30d.

The fixed table 30a is fixed to the upper surface of the recessed portion of the stage unit STU. The base portion 30 is fixed onto the stage unit STU through the fixed table 30a so that the positional deviation does not occur. The rotary table 30b is disposed on the fixed table 30a through the rotary mechanism 30c. The rotary table 30b is adapted to be rotatable about the Z axis serving as the rotary axis relative to the fixed table 30a. The rotary mechanism 30c is a driving mechanism which is provided between the fixed table 30a and the rotary table 30b, and applies the rotation force to the rotary table 30b. Each of the support members 30d is a column member of which the −Z-direction-side end portion is fixed onto the rotary table 30b. The support members 30d are provided at a plurality of positions, for example, two positions of the rotary table 30b. The +Z-direction-side end portion of the support member 30d is inserted into the arm portion 31.

The arm portion 31 is supported by the support members 30d of the base portion 30. The arm portion 31 moves the holding portion 32 to different positions inside the substrate processing unit SPU. The arm portion 31 includes a casing 31a formed in a pentagonal column. A front end surface 31b of the casing 31a is provided with an opening 31c. A rotary mechanism 33, a suction mechanism 34, and a moving mechanism 35 are provided inside the casing 31a.

The rotary mechanism 33 is disposed on the +Z direction side inside the casing 31a. The rotary mechanism 33 includes a motor device 33a and a rotary shaft member 33b. The motor device 33a and the rotary shaft member 33b are adapted to be movable together in the horizontal direction in the drawing. The motor device 33a is a driving device which applies the rotation force to the rotary shaft member 33b. The rotary shaft member 33b is a bar-shaped member which has a circular section and is disposed in parallel to the XY plane.

The rotary shaft member 33b is adapted to be rotatable about the center of the circle serving as the rotary axis by the driving force of the motor device 33a. The rotary shaft member 33b is disposed so that one end thereof protrudes from the opening 31c to the outside of the casing 3 la (protrusion 33c). The end surface of the rotary shaft member 33b on the side of the protrusion 33c is provided with a concave portion 33d used for mounting the holding portion 32 thereto. The concave portion 33d is formed in a circular shape in a sectional view. The protrusion 33c includes a fixing mechanism which fixes the holding portion 32 in the state where the holding portion 32 is mounted to the concave portion 33d. Since the holding portion 32 is fixed by the fixing mechanism, the rotary shaft member 33b and the holding portion 32 are adapted to be movable together.

The rotary shaft member 33b includes a perforation hole 33e. The perforation hole 33e is formed so as to perforate a range from a bottom surface 33f of the concave portion 33d of the rotary shaft member 33b to an end surface 33g on the other side of the rotary shaft member 33b. The bottom surface 33f of the concave portion 33d of the rotary shaft member 33b communicates with the end surface 33g through the perforation hole 33e.

The suction mechanism 34 is provided in the end surface 33g of the rotary shaft member 33b. The suctioning means 34 includes a suctioning device such as a suction pump 34a. The suction pump 34a is connected to the perforation hole 33e of the end surface 33g of the rotary shaft member 33b. The suction pump 34a suctions the perforation hole 33e from the end surface 33g of the rotary shaft member 33b, thereby suctioning the holding portion 32 disposed on the bottom surface 33f of the concave portion 33d communicating with the perforation hole 33e.

The moving mechanism 35 is disposed on the −Z direction side inside the casing 31a. The moving mechanism 35 includes a motor device 35a, a rotary shaft member 35b, and a movable member 35c. The motor device 35a is a driving device which applies the rotation force to the rotary shaft member 35b. The rotary shaft member 35b is a bar-shaped member which has a circular section and of which one end is inserted in the motor device 35a. The rotary shaft member 35b is adapted to be rotatable about the center of the circle serving as the rotary axis by the motor device 35a.

The movable member 35c includes a screw-connection portion 35d and a connection portion 35e. The screw-connection portion 35d is integrally formed with the rotary shaft member 35b, and has a thread ridge (not shown) formed on the surface thereof The connection portion 35e is fixed to, for example, the motor device 33a of the rotary mechanism 33. A thread ridge is formed on the lower surface of the connection member 35e, and adapted to mesh with the thread ridge formed in the screw-connection portion 35d.

When the motor device 35a rotates the rotary shaft member 35b, the rotary shaft member 35b and the screw-connection portion 35d are adapted to rotate together. By rotation of the screw-connection portion 35d, the connection member 35e meshing with the thread ridge of the screw-connection portion 35d is adapted to move in the left or right direction in the drawing, and the connection member 35e and the fixing mechanism 33 fixed to the connection member 35e are adapted to move together in the left or right direction in the drawing. By means of the movement, the holding portion 32 provided in the right end of the rotary mechanism 33 in the drawing is adapted to move in the horizontal direction in the drawing.

The holding portion 32 is separably fixed to the concave portion 33d of the rotary shaft member 33b. The holding portion 32 holds, for example, the substrate S by using the holding force such as the absorption force. The holding portion 32 includes a suction member 36 and a blocking member 37. The suction member 36 and the blocking member 37 are separably provided.

Figure 5A:
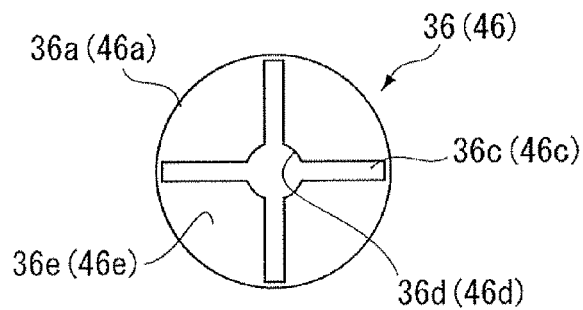
FIGS. 5A and 5B are views showing a constitution of a suction member.
Figure 5B:
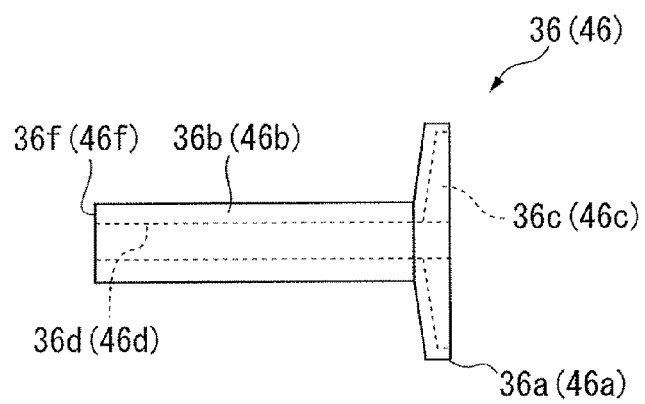

FIGS. 5A and 5B are views showing a constitution of the suction member 36. FIG. 5A is a front view showing the suction member 36, and FIG. 5B is a side view showing the suction member 36.

The suction member 36 includes an absorbing portion 36a and a mounting portion 36b. The absorbing portion 36a is provided on the front-surface-side of the suction member 36 in the drawing so as to have a disk shape. The absorbing portion 36a is a portion which absorbs the substrate S. The front-surface-side end surface of the absorbing portion 36a is formed as an absorbing surface 36e which absorbs the substrate S. The absorbing surface 36e is provided with a groove portion 36c. The groove portion 36c is formed in, for example, a cross shape in a front view. When viewed from the front surface of the absorbing portion 36a, the groove portion 36c is formed to be deeper toward the center thereof relative to the absorbing surface 36e.

The mounting portion 36b is formed in a bar shape so as to be located at the center of the rear surface of the suction member 36. The mounting portion 36b is a portion inserted into the concave portion 33d. The rear-surface-side end surface of the mounting portion 36b is formed in a contact surface 36f which comes into contact with the bottom portion of the concave portion 33d during the mounting operation. The mounting portion 36b is formed to have a diameter of not more than that of the concave portion 33d.

The suction member 36 is provided with a perforation hole 36d. The perforation hole 36d is formed at the center of the absorbing portion 36a and the mounting portion 36b, and is formed to perforate the absorbing portion 36a and the mounting portion 36b from the front surface thereof to the rear surface thereof. The perforation hole 36d is connected to the groove portion 36c on the side of the absorbing portion 36a. The absorbing surface 36e including the groove portion 36c communicates with the contact surface 36f through the perforation hole 36d.

In the case where the mounting portion 36b is mounted to the concave portion 33d, the perforation hole 36d communicates with the perforation hole 33e of the rotary shaft member 33b. For this reason, the absorbing surface 36e of the suction member 36 is connected to the suction pump 34a of the suctioning mechanism 34 through the perforation holes 33e and 36d.

Figure 6A:
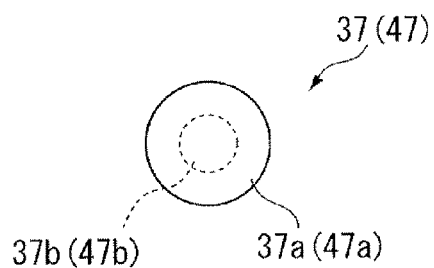
FIGS. 6A and 6B are views showing a constitution of a blocking member.
Figure 6B:
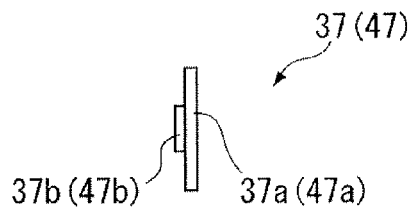

FIGS. 6A and 6B are views showing a constitution of the blocking member 37. FIG. 6A is a front view showing the blocking member 37, and FIG. 6B is a side view showing the blocking member 37.

The blocking member 37 includes a blocking portion 37a which is formed in a disk shape and an engagement portion 37b which is formed in a cylindrical shape so as to be located at the center of the rear surface of the blocking portion 37a.

The blocking portion 37a is formed to have a diameter smaller than that of the opening of the substrate S so as to be inserted into the opening of the substrate S. The thickness (a dimension in the horizontal direction in FIG. 6B) of the blocking portion 37a is formed to be thinner than that of the substrate S. In the case where the blocking portion 37a is inserted into the opening of the substrate S, the blocking portion 37a does not protrude from the substrate S.

The engagement portion 37b is formed so as to be inserted into the perforating hole 36d of the absorbing portion 36a. The engagement portion 37b is formed to have a diameter of not more than that of the perforation hole 36d. The engagement portion 37b is formed to have a thickness dimension (a dimension in the horizontal direction in FIG. 6B) smaller than the distance between the deepest position of the groove portion 36c formed at the absorbing portion 36a and the absorbing surface of the absorbing portion 36a. The engagement portion 37b is able to be inserted into the perforation hole 36d.

Figure 7:
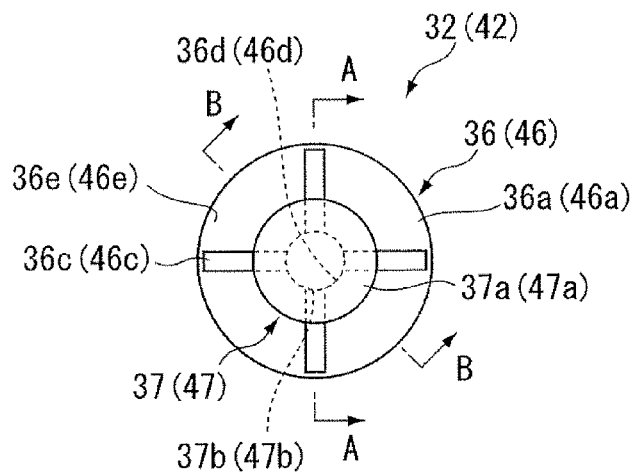
FIG. 7 is a view showing a constitution of a holding portion.
Figure 8A:
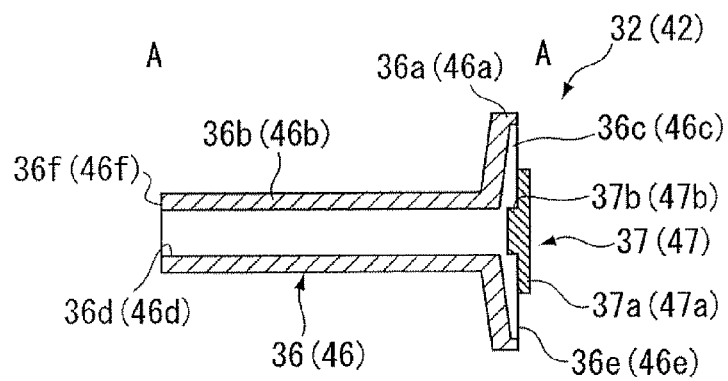
FIGS. 8A and 8B are views showing the constitution of the holding portion.
Figure 8B:
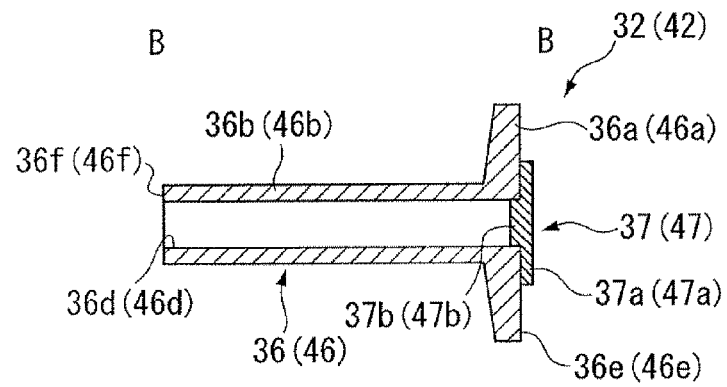

FIG. 7 is a front view showing the state where the blocking member 37 is mounted to the suction member 36. FIG. 8A is a sectional view taken along the line A-A in FIG. 7. FIG. 8B is a sectional view taken along the line B-B in FIG. 7.

When the engagement portion 37b is inserted into the perforation hole 36d of the suction member 36, the blocking member 37 is mounted to the suction member 36. In the mounting state, the rear surface of the blocking portion 37a is supported to the absorbing surface of the absorbing portion 36a, and a part of the groove portion 36c is blocked by the blocking portion 37a in a front view thereof. Since the thickness dimension of the engagement portion 37b is smaller than the distance between the deepest position of the groove portion 36c and the absorbing surface, as shown in FIG. 8A, the perforation hole 36d is not completely blocked by the engagement portion 37b, and a gap is formed between the groove portion 36c and the perforation hole 36d.

The loading carrying device SC1 with the above-described constitution allows the holding portion 32 to access both the coating device CT and the loading position LP in such a manner that the arm portion 31 rotates about the Z axis serving as the rotary axis or moves in the XY plane. The rotary shaft members disposed in the arm portion 31 and the like may have a constitution in which plural shaft members are connected through couplings.

Returning to FIGS. 1 to 3, the unloading carrying device SC2 accesses the coating device CT, the unloading position UP of the unloading buffer mechanism BF2, and the peripheral edge removing device EBR so as to carry the substrate S therebetween. The unloading carrying device SC2 includes a base portion 40 (a fixed table 40a and a rotary table 40b), an arm portion 41, and a holding portion (suction portion) 42. Since the constitution of the unloading carrying device SC2 is the same as that of the loading carrying device SC1 the description of the respective constituents will be omitted. In FIGS. 4 to 8, the constituents of the unloading carrying device SC2 corresponding to the constituents of the loading carrying device SC1 are indicated by the parenthesized signs. Hereinafter, upon mentioning the constituents of the unloading carrying device SC2, the names of the corresponding constituents of the loading carrying device SC1 are used, and the parenthesized signs in FIGS. 4 to 8 are respectively added to the names.

Figure 9:
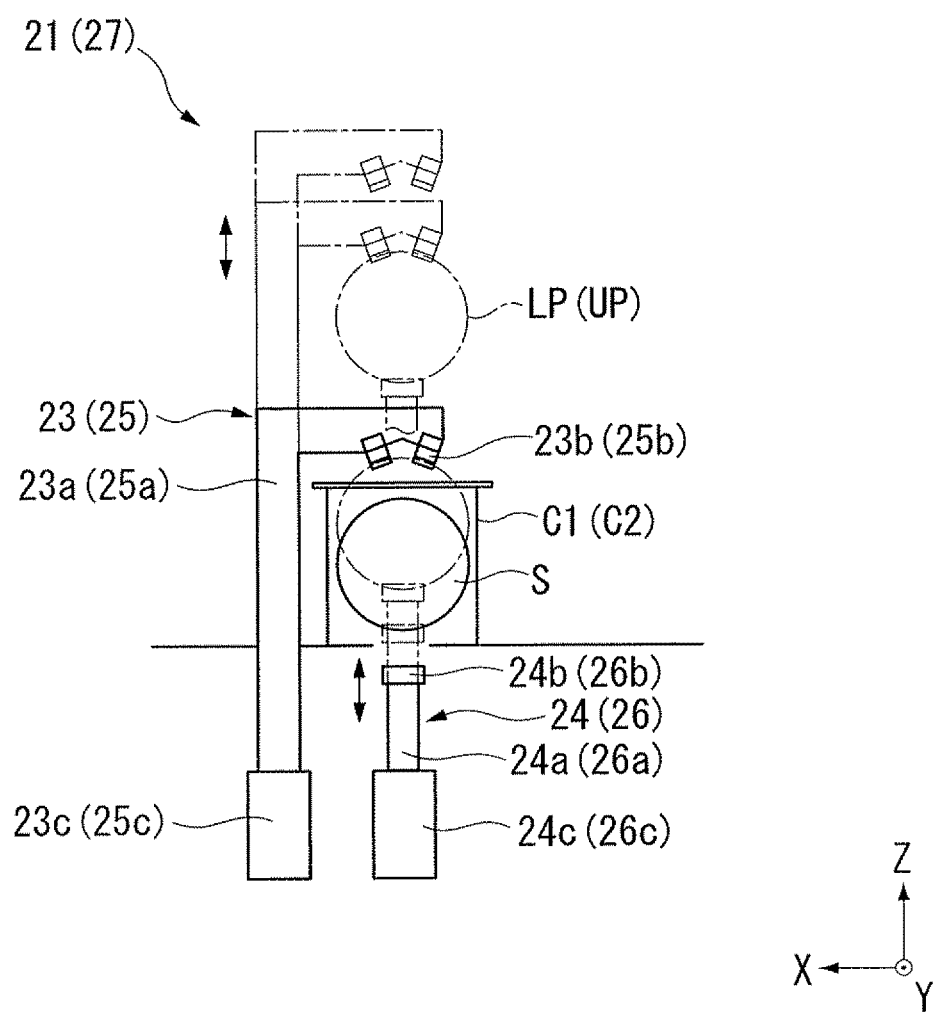
FIG. 9 is a view showing a constitution of a substrate loading mechanism and a substrate unloading mechanism.
Figure 10:
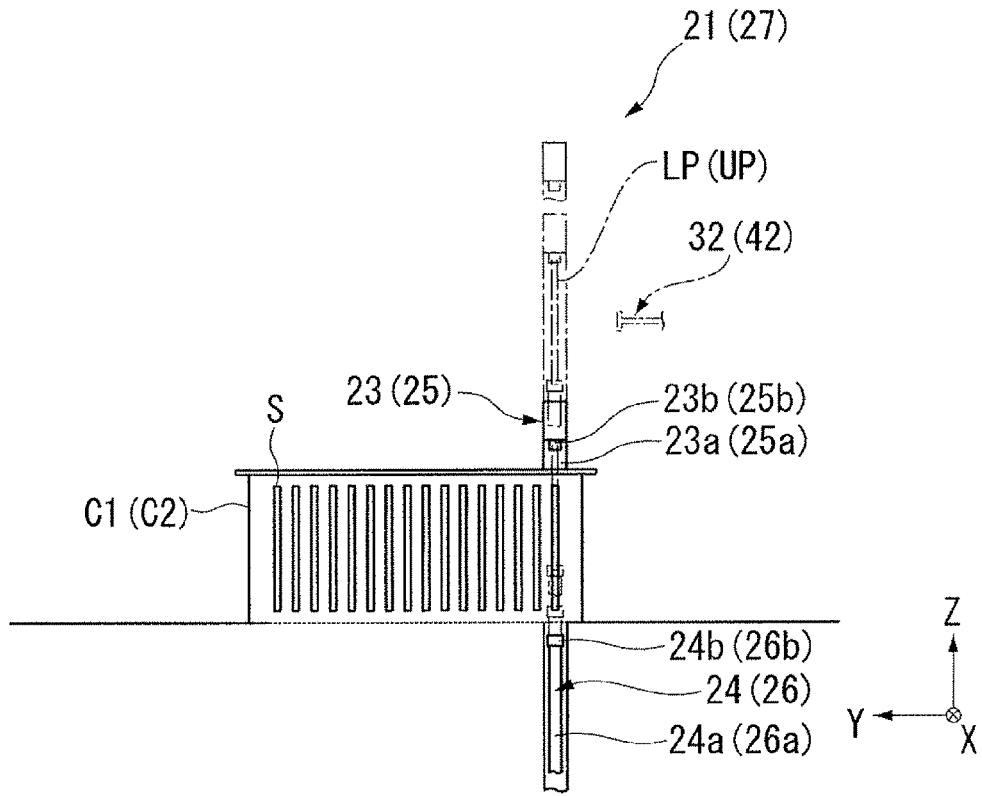
FIG. 10 is a view showing the constitution of the substrate loading mechanism and the substrate unloading mechanism.
Figure 11:
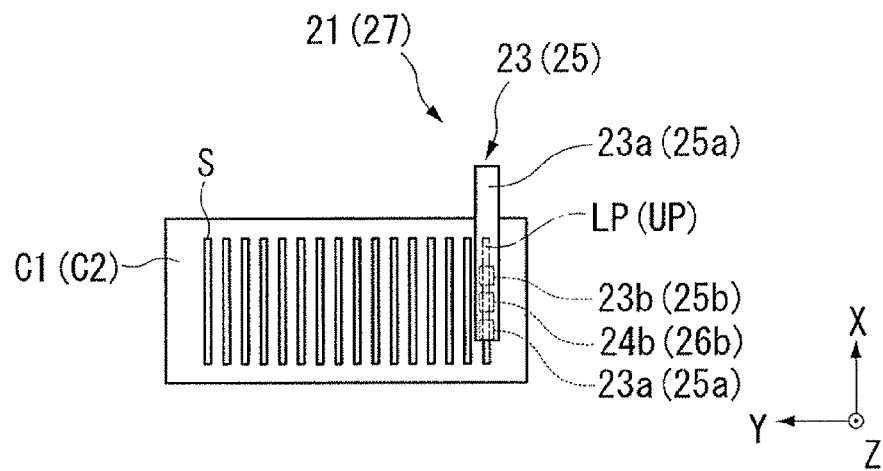
FIG. 11 is a view showing the constitution of the substrate loading mechanism and the substrate unloading mechanism.

The substrate processing unit SPU includes a substrate loading mechanism (pickup mechanism) 21 and a substrate unloading mechanism 27 in addition to the above-described constitution. The substrate loading mechanism 21 is disposed in the vicinity of the standby position P4. FIGS. 9 to 11 are views schematically showing a constitution of the substrate loading mechanism 21.

As shown in the drawings, the substrate loading mechanism 21 includes a substrate upper portion holding mechanism 23 and a substrate lower portion holding mechanism 24. The substrate upper portion holding mechanism 23 is disposed on the +X direction side of the standby position P4. The substrate upper portion holding mechanism 23 moves in the Z direction while holding the +Z-direction-side portion of the substrate S. The substrate upper portion holding mechanism 23 includes an elevating member 23a, a clamping member 23b, and an elevating mechanism 23c.

The elevating member 23a is a column member which is formed in an L-shape in a side view and is movable in the Z direction. The elevating member 23a includes a column portion which extends in the Z direction and a protrusion which protrudes from the front end of the column portion in the X direction. Among them, the column portion is provided up to the +Z direction side of the +Z-direction-side end surface of the loading cassette C1. The protrusion of the elevating member 23a is disposed at a position overlapping with the loading position LP in a plan view. The −Z-direction-side portion of the protrusion is provided with a concave portion matching with the shape of the substrate S.

The clamping member 23b is mounted to the concave portion of the elevating member 23a. Accordingly, the clamping member 23b is provided at a position overlapping with the loading position LP in a plan view. The elevating mechanism 23c is a driving portion which is mounted to the elevating member 23a, and is disposed on the −Z direction side of the loading cassette C1. As the elevating mechanism 23c, for example, a driving mechanism such as an air cylinder may be used.

The substrate lower portion holding mechanism 24 is provided at a position overlapping with the center of the loading position LP in a plan view. The substrate lower portion holding mechanism 24 moves in the Z direction while holding the −Z-direction-side portion of the substrate S. The substrate lower portion holding mechanism 24 includes an elevating member 24a, a clamping member 24b, and an elevating mechanism 24c. The elevating member 24a is a column member which is formed in a bar shape and is movable in the Z direction. The clamping member 24b is mounted to the +Z-direction-side front end of the elevating member 24a. The clamping member 24b is disposed at a position overlapping with the center of the loading position LP in a plan view. The elevating mechanism 24c is a driving portion which is mounted to the elevating member 24a, and is disposed on the −Z direction side of the loading cassette C1. As the elevating mechanism 24c, for example, a driving mechanism such as an air cylinder may be used.

It is possible to separately operate the elevating mechanism 23c of the substrate upper portion holding mechanism 23 and the elevating mechanism 24c of the substrate lower portion holding mechanism 24, and to operate them in an interlocking manner.

The substrate unloading mechanism 27 is disposed in the vicinity of the standby position P8. The substrate unloading mechanism 27 has the same constitution as that of the substrate loading mechanism 21. In FIGS. 9 to 11, the constituents (including the unloading position UP) of the substrate unloading mechanism 27 corresponding to the constituents (including the loading position LP) of the substrate loading mechanism 21 are indicated by the parenthesized signs.

The substrate unloading mechanism 27 includes a substrate upper portion holding mechanism 25 and a substrate lower portion holding mechanism 26. The substrate upper portion holding mechanism 25 includes an elevating member 25a, a clamping member 25b, and an elevating mechanism 25c. The substrate lower portion holding mechanism 26 includes an elevating member 26a, a clamping member 26b, and an elevating mechanism 26c. Since the positional relationship, the function, and the like of the respective constituents of the substrate unloading mechanism 27 are the same as those of the corresponding constituents of the substrate loading mechanism 21, the description thereof will be omitted.

Substrate Unloading Unit

Returning to FIGS. 1 to 3, the substrate unloading unit ULU is disposed on the +X direction side of the substrate processing unit SPU in the substrate processing system SYS. The substrate unloading unit ULU is a unit which collects the unloading cassette C2 accommodating the processed substrate S and receives the empty unloading cassette C2. The substrate unloading unit ULU is elongated in the Y direction, and is capable of accommodating plural unloading cassettes C2 arranged in the Y direction.

The substrate unloading unit ULU includes a cassette entrance 60 and a cassette moving mechanism (second moving mechanism) 61. The cassette entrance 60 is an opening which is provided on the −Y direction side of the cover member covering the substrate unloading unit ULU. The cassette entrance 60 is an inlet (supply opening) for the empty unloading cassette C2, and an outlet (collection opening) for the unloading cassette C2 accommodating the processed substrate S.

The cassette moving mechanism 61 includes, for example, a driving mechanism such as a belt conveyor mechanism. In the embodiment, as the driving mechanism, conveyor belts are provided. The conveyor belts extend in the Y direction from the +Y-direction-side end portion of the substrate unloading unit ULU to the −Y-direction-side end portion thereof, where two conveyor belts are arranged in the X direction.

Among two conveyor belts, the supply belt 61a is a conveyor belt which is disposed on the −X direction side. The +Z-direction-side surface of the supply belt 61a is used as a conveyor surface. The supply belt 61a is adapted to rotate so that the conveyor surface moves in the +Y direction. Plural unloading cassettes C2, which enter the substrate unloading unit ULU through the cassette entrance 60, are placed on the conveyor surface of the supply belt 61a. The unloading cassettes C2 are moved to the carrying unit CRU by the rotation of the supply belt 61a.

Among two conveyor belts, the collection belt 61b is a conveyor belt which is disposed on the +X direction side. The +Z-direction-side surface of the collection belt 61b is used as a conveyor surface. The collection belt 61b is configured to rotate so that the conveyor surface moves in the −Y direction. Plural unloading cassettes C2' accommodating the processed substrates S are placed on the conveyor surface of the collection belt 61b. The unloading cassettes C2' are allowed to move to the cassette entrance 60 by rotation of the collection belt 61b.

In the embodiment, for example, the unloading cassettes C2 are capable of staying in a standby state at standby positions (container standby portion) provided at five positions on the supply belt 61a and the collection belt 61b. In the substrate unloading unit ULU, it is possible to move the standby position of the unloading cassette C2 by rotating the supply belt 61a and the collection belt 61b. It is possible to shorten the carrying time of the unloading cassette C2 by moving the standby position.

Carrying Unit

The carrying unit CRU is disposed in an area along the +Y-direction-side edge inside the substrate processing system SYS, and is disposed so as to be adjacent to the substrate processing unit SPU, the substrate loading unit LDU, and the substrate unloading unit ULU. The carrying unit CRU carries the loading cassette C1 between the substrate processing unit SPU and the substrate loading unit LDU, and carries the unloading cassette C2 between the substrate processing unit SPU and the substrate unloading unit ULU. The carrying unit CRU includes a rail mechanism RL and a cassette carrying device CC.

The rail mechanism RL is fixed onto the stage unit STU, and extends in a linear shape in the X direction from the −X-direction-side end portion of the carrying unit CRU to the +X-direction-side end portion thereof The rail mechanism RL is a guiding mechanism which guides the moving position of the cassette carrying device CC. The rail mechanism RL includes two rail members 70 which are parallel in the Y direction.

The cassette carrying device CC is provided on two rail members 70 so as to be suspended on the two rail members 70 in a plan view. The cassette carrying device CC is a carrying device which accesses the buffer mechanism BF of the substrate processing unit SPU, the substrate loading unit LDU, and the substrate unloading unit ULU, and holds and carries the loading cassette C1 and the unloading cassette C2. The cassette carrying device CC includes a movable member 71, a cassette support plate 72, a support plate rotating mechanism 73, a cassette holding member 74, a holding member elevating mechanism 75, and a holding member sliding mechanism 76.

The movable member 71 is formed in an H-shape in a plan view, and includes concave portions 71a which are respectively fitted to two rail members 70. The movable member 71 includes therein, for example, a driving mechanism (a motor mechanism or the like) which is not shown in the drawing. The movable member 71 is adapted to be movable in a linear area along the rail members 70 by the driving force of the driving mechanism.

The cassette support plate 72 is a plate-shaped member which is fixed to the movable member 71 and is formed in a rectangular shape in a plan view. The cassette support plate 72 is formed to have a dimension larger than that of the bottom portion of each of the loading cassette C1 and the unloading cassette C2, and is capable of stably placing the loading cassette C1 and the unloading cassette C2 thereon. Since the cassette support plate 72 is fixed to the movable member 71, the cassette support plate 72 moves together with the movable member 71.

The support plate rotating mechanism 73 is a rotary mechanism which rotates the cassette support plate 72 in the XY plane where the Z axis serves as the rotary axis. The support plate rotating mechanism 73 is capable of changing the longitudinal direction of each of the loading cassette C1 and the unloading cassette C2 placed on the cassette carrying device CC by rotating the cassette support plate 72.

The cassette holding member 74 is a holding member which is disposed on the +Y direction side of the cassette support plate 72 in a plan view and is formed in a U-shape in a plan view. The cassette holding member 74 is provided so that the X-direction position thereof overlaps with the cassette support plate 72. The cassette holding member 74 is supported to the movable member 71 through a support member (not shown), and is movable together with the movable member 71. Both end portions, formed in a U-shape, of the cassette holding member 74 are formed as a holding portion 74a which engages with the engagement portion Cx provided in each of the loading cassette C1 and the unloading cassette C2. A gap of the holding portion 74a (both end portions formed in a U-shape) in the X direction is adjustable in accordance with a gap of the engagement portion Cx provided in each of the loading cassette C1 and the unloading cassette C2. The cassette holding member 74 is capable of further reliably holding the loading cassette C1 and the unloading cassette C2 in the Z direction in such a manner that the holding portion 74a engages with the engagement portion Cx.

The holding member elevating mechanism 75 is a moving mechanism which is provided in the cassette holding member 74 and moves the cassette holding member 74 in the Z direction. As the holding member elevating mechanism 75, for example, a driving mechanism such as an air cylinder may be used. When the cassette holding member 74 moves in the +Z direction by using the holding member elevating mechanism 75, it is possible to lift the loading cassette C1 and the unloading cassette C2 held by the cassette holding member 74. On the contrary, when the cassette holding member 74 moves in the −Z direction by using the holding member elevating mechanism 75, it is possible to place the lifted cassette on a desired position.

The holding member sliding mechanism 76 is a moving mechanism which is provided in the cassette holding member 74, and moves the cassette holding member 74 in the Y direction. The holding member sliding mechanism 76 includes a guide bar 76a which extends in the Y direction and a movable member 76b which moves along the guide bar 76a. The movable member 76b is fixed to the cassette holding member 74. When the movable member 76b moves in the Y direction along the guide bar 76a, the cassette holding member 74 moves together with the movable member 76b in the Y direction.

Control Unit

The control unit CNU is provided in the stage unit STU of the substrate processing system SYS. The control unit CNU includes, for example, a control device which controls all operations in the respective units and a material supply source which supplies a material required for each unit, where all operations include a substrate processing operation in the substrate processing unit SPU, a cassette moving operation in the substrate loading unit LDU or the substrate unloading unit ULU, a carrying operation in the carrying unit CRU, and the like. The material supply source may be exemplified by, for example, a liquid material supply source, a cleaning liquid supply source, or the like.

Next, an operation of the substrate processing system SYS having the above-described constitution will be described. The operations performed by the respective units of the substrate processing system SYS are controlled by the control unit CNU. In the below description, the unit performing the operation is mainly described, but actually, the operation is performed on the basis of the control of the control unit CNU.

Cassette Supply Operation

First, the cassette supply operation in which the loading cassette C1 accommodating the unprocessed substrate S is disposed in the substrate loading unit LDU, and the empty unloading cassette C2 is disposed in the substrate unloading unit ULU will be described.

For example, by a supply device (not shown) or the like, the loading cassette C1 accommodating the unprocessed substrate S is supplied to the substrate loading unit LDU through the cassette entrance 10. The substrate loading unit LDU checks that the loading cassette C1 is placed on the −Y-direction-side end portion of the supply belt 11a, and then rotates the supply belt 11a. The loading cassette C1 moves in the +Y direction by the rotation of the supply belt 11a. The substrate loading unit LDU temporarily stops the rotation of the belt when the supply belt 11a moves by an amount corresponding to a space of the loading cassette C1, and allows the loading cassette C1 to be in a standby state until the next loading cassette C1 is supplied. When the next loading cassette C1 is supplied, in the same manner as described above, the substrate loading unit LDU temporarily stops the rotation of the belt when the supply belt 11a moves by an amount corresponding to a space of the loading cassette C1, and allows the loading cassette C1 to be in a standby state again. When the loading cassettes C1 are sequentially supplied by rotating the supply belt 11a, plural loading cassettes C1 accommodating the unprocessed substrates S are arranged inside the substrate loading unit LDU.

On the other hand, for example, by a supply device (not shown) or the like, the empty unloading cassette C2 is supplied to the substrate unloading unit ULU through the cassette entrance 60. The substrate unloading unit ULU checks that the unloading cassette C2 is placed on the −Y-direction-side end portion of the supply belt 61a, and then rotates the supply belt 61a. The unloading cassette C2 moves in the +Y direction by the rotation of the supply belt 61a. The substrate unloading unit ULU temporarily stops the rotation of the belt when the supply belt 61a moves by an amount corresponding to a space of the unloading cassette C2, and allows the unloading cassette C2 to be in a standby state until the next cassette C2 is supplied. When the next unloading cassette C2 is supplied, in the same manner as described above, the substrate unloading unit ULU temporarily stops the rotation of the belt when the supply belt 61a moves by an amount corresponding to a space of the unloading cassette C2, and allows the unloading cassette C2 to be in a standby state again. When the unloading cassettes C2 are sequentially supplied by rotating the supply belt 61a, plural empty unloading cassettes C2 are arranged inside the substrate unloading unit ULU.

Cassette Carrying Operation

Next, the cassette carrying operation in which the loading cassette C1 supplied to the substrate loading unit LDU and the unloading cassette C2 supplied to the substrate unloading unit ULU are respectively supplied to the substrate processing unit SPU will be described. The cassette carrying operation is performed by using the cassette carrying device CC provided in the carrying unit CRU.

The operation of carrying the loading cassette C1 will be described. The carrying unit CRU moves the cassette carrying device CC in the X direction up to a position adjacent to the substrate loading unit LDU, and performs a positioning operation so as to overlap with the position of the loading cassette C1 in the X direction. After the positioning operation, the carrying unit CRU moves the cassette holding member 74 in a sliding manner in the −Y direction, and disposes the holding portion 74a at the −Z-direction-side portion of the engagement portion Cx of the loading cassette C1 staying in a standby state at the farthest +Y-direction-side position inside the substrate loading unit LDU. The carrying unit CRU adjusts the X-direction gap of the holding portion 74a and the Z-direction position thereof in advance so that the holding portion 74a is smoothly disposed in a sliding manner at the −Z-direction-side portion of the engagement portion Cx.

After the holding portion 74a engages with the engagement portion Cx, the carrying unit CRU moves the cassette member 74 in the +Z direction so as to lift the loading cassette C1. The carrying unit CRU moves the cassette holding member 74 lifting the loading cassette C1 in the +Y direction in a sliding manner so that the loading cassette C1 moves to a position overlapping with the cassette support plate 72 in a plan view. The carrying unit CRU moves the cassette holding member 74 located at that position in the −Z direction so as to place the loading cassette C1 on the cassette support plate 72. The carrying unit CRU adjusts a direction of the cassette support plate 72 in advance so that the longitudinal direction of the cassette C1 aligns with the longitudinal direction of the cassette support plate 72 upon placing the loading cassette C1 on the cassette support plate 72. According to theses operations, the loading cassette Cl located on the farthest +Y direction side inside the substrate loading unit LDU is transferred to the cassette carrying device CC. After the transfer operation, the substrate loading unit LDU moves the supply belt 11a so that the loading cassette C1 disposed on the farthest +Y direction side among the rest of the loading cassettes C1 inside the substrate loading unit LDU is disposed at the +Y-direction-side end portion of the substrate loading unit LDU. According to this operation, since the rest of the loading cassettes C1 move together in the +Y direction, the space on the −Y direction side on the supply belt 11a is empty. Accordingly, a new loading cassette C1 is supplied to the empty space by a supply mechanism (not shown).

After the transfer operation of the loading cassette C1, the carrying unit CRU moves the cassette carrying device CC in the +X direction, and rotates the cassette support plate 72 so that the longitudinal direction of the cassette support plate 72 aligns with the Y direction. After the rotation of the cassette support plate 72, the carrying unit CRU performs a positioning operation of the cassette carrying device CC so that the X-direction position of the standby position P1 set by the loading buffer mechanism BF1 of the substrate processing unit SPU overlaps with the X-direction position of the loading cassette C1. Any one of the rotation operation of the cassette support plate 72 and the positioning operation of the cassette carrying device CC may be performed first.

After the positioning operation (or the rotation operation), the carrying unit CRU lifts the loading cassette C1 placed on the cassette support plate 72 by using the cassette holding member 74, and in this state, moves the cassette holding member 74 in a sliding manner in the −Y direction. When the loading cassette C1 is disposed at a position overlapping with the standby position P1 in a plan view, the carrying unit CRU moves the cassette holding member 74 in the −Z direction so as to place the loading cassette C1 at the standby position P1.

After the placing operation of the loading cassette C1, the carrying unit CRU cancels the holding force applied to the loading cassette C1 and withdraws the cassette holding member 74 in the +Y direction. According to these operations, the loading cassette C1 transferred to the cassette carrying device CC is carried to the substrate processing unit SPU.

An operation of carrying the unloading cassette C2 will be described. This carrying operation is performed by using the cassette carrying device CC used in the operation of carrying the loading cassette C1. The carrying unit CRU moves the cassette carrying device CC in the X direction up to a position adjacent to the substrate unloading unit ULU, and performs a positioning operation so as to overlap with the position of the unloading cassette C2 in the X direction. Then, the carrying unit CRU performs a transfer operation of the unloading cassette C2 disposed on the farthest +Y direction side inside the substrate unloading unit ULU. The transfer operation is the same as that of the loading cassette C1. After the transfer operation, the supply belt 61a is moved so that the rest of the unloading cassettes C2 move together in the +Y direction. Since the space of the −Y-direction-side end portion on the supply belt 61a is empty in accordance with the movement of the unloading cassette C2, a new unloading cassette C2 is supplied to the empty space by a supply mechanism (not shown).

After the transfer operation of the unloading cassette C2, the carrying unit CRU moves the cassette carrying device CC in the −X direction toward the unloading buffer mechanism BF2, and rotates the cassette support plate 72 so that the longitudinal direction of the cassette support plate 72 aligns with the Y direction. After the rotation of the cassette support plate 72, the carrying unit CRU performs a positioning operation of the cassette carrying device CC so that the X-direction position of the standby position P5 set by the unloading buffer mechanism BF2 of the substrate processing unit SPU overlaps with the X-direction position of the unloading cassette C2.

After the positioning operation, the carrying unit CRU places the unloading cassette C2 placed on the cassette support plate 72 at the standby position P5, cancels the holding force applied to the unloading cassette C2, and then withdraws the cassette holding member 74 in the +Y direction. The placing operation and the withdrawing operation are the same as those of the loading cassette C1. According to these operations, the unloading cassette C2 transferred to the cassette carrying device CC is carried to the substrate processing unit SPU.

Substrate Processing Operation

Next, a processing operation of the substrate processing unit SPU will be described.

The substrate processing unit SPU performs a moving operation of moving the loading cassette C1 accommodating the unprocessed substrate S and the empty unloading cassette C2, a loading operation of loading the substrate S accommodated in the loading cassette C1, a coating operation of coating a liquid material on the substrate S, a peripheral edge removing operation of removing the peripheral edge of the thin film formed on the substrate S, an unloading operation of unloading the processed substrate S, and a moving operation of moving the empty loading cassette C1 and the unloading cassette C2 accommodating the processed substrate S. In addition to the respective operations, the carrying operation of carrying the substrate S is performed between the loading operation and the coating operation, between the coating operation and the peripheral edge removing operation, and between the shape forming operation and the unloading operation.

Among these operations, first, the moving operation of the loading cassette C1 and the unloading cassette C2 will be described. The substrate processing unit SPU moves the loading cassette C1 carried to the standby position PI of the loading buffer mechanism BF1 to the standby position P2 by using the conveyor belt 20a, and further moves the loading cassette C1 moved to the standby position P2 to the standby position P4 by using the conveyor belt 20b. In the same manner, the substrate processing unit SPU moves the unloading cassette C2 carried to the standby position P5 of the unloading buffer mechanism BF2 to the standby position P6 by using the conveyor belt 22a, and further moves the unloading cassette C2 moved to the standby position P6 to the standby position P8 by using the conveyor belt 22b. According to these operations, the loading cassette C1 and the unloading cassette C2 carried to the substrate processing unit SPU are disposed at a process start position.

Next, the loading operation of the substrate S will be described. After the substrate processing unit SPU checks that the loading cassette C1 is disposed at the standby position P4, the substrate processing unit SPU disposes the substrate upper portion holding mechanism 23 at the clamping position and moves the elevating member 24a of the substrate lower portion holding mechanism 24 in the +Z direction. According to the movement, the clamping member 24b mounted to the +Z-direction-side end portion of the elevating member 24a comes into contact with the −Z-direction-side portion of one sheet of substrate S disposed on the farthest −Y direction side among the substrate S accommodated in the loading cassette C1, and the −Z-direction-side portion of the substrate S is held by the clamping member 24b.

After the −Z-direction-side portion of the substrate S is held, the substrate processing unit SPU moves further the elevating member 24a in the +Z direction in the held state of the substrate S. According to the movement, the substrate S is lifted in the +Z direction side by the substrate lower portion holding mechanism 24, the +Z-direction-side portion of the substrate S comes into contact with the clamping member 23b of the substrate upper portion holding mechanism 23, and then the +Z-direction-side portion of the substrate S is held by the clamping member 23b. The substrate S is held by both clamping member 23b of the substrate upper portion holding portion 23 and the clamping member 24b of the substrate lower portion holding mechanism 24.

The substrate processing unit SPU simultaneously moves the elevating members 23a and 24a in the +Z direction in the state where the substrate S is held by the clamping members 23b and 24b. The substrate processing unit SPU moves the elevating mechanisms 23c and 24c in an interlocking manner so that the elevating members 23a and 24a move at the same speed. The substrate S held by the clamping members 23b and 24b moves in the +Z direction. When the substrate S is disposed at the loading position LP, the substrate processing unit SPU stops the movement of the elevating members 23a and 24a. In this manner, the loading operation of the substrate S is performed.

After the loading operation, the substrate processing unit SPU allows the holding portion 32 of the loading carrying device SC1 to access the loading position LP, and allows the substrate S disposed at the loading position LP to be held by the holding portion 32. When the holding portion 32 accesses the loading position LP, the substrate processing unit SPU rotates the rotary table 30b so that the front end surface 31b of the arm portion 31 faces the +Y direction, and drives the motor device 35a so that the arm portion 31 moves in the Y direction. In accordance with the movement of the arm portion 31, the holding portion 32 mounted to the front end surface 31b (see FIG. 4) of the arm portion 31 accesses the loading position LP.

Figure 12:
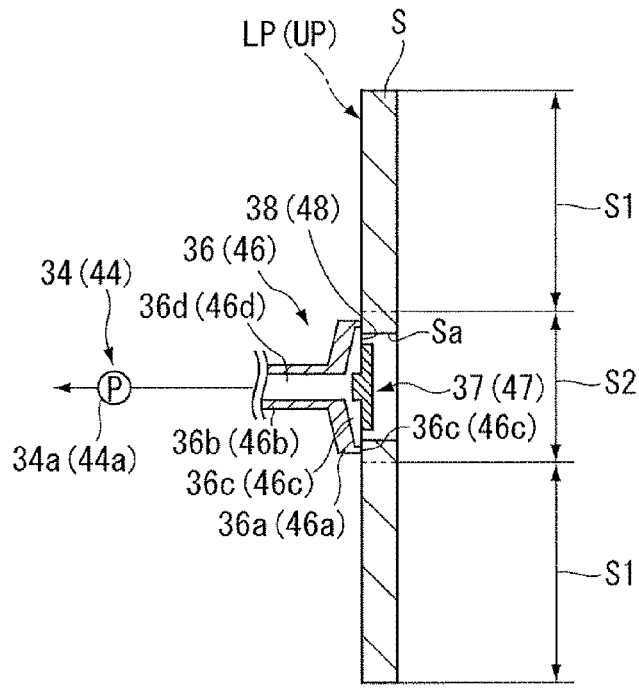
FIG. 12 is a view showing an operation of the substrate carrying device.
Figure 13:
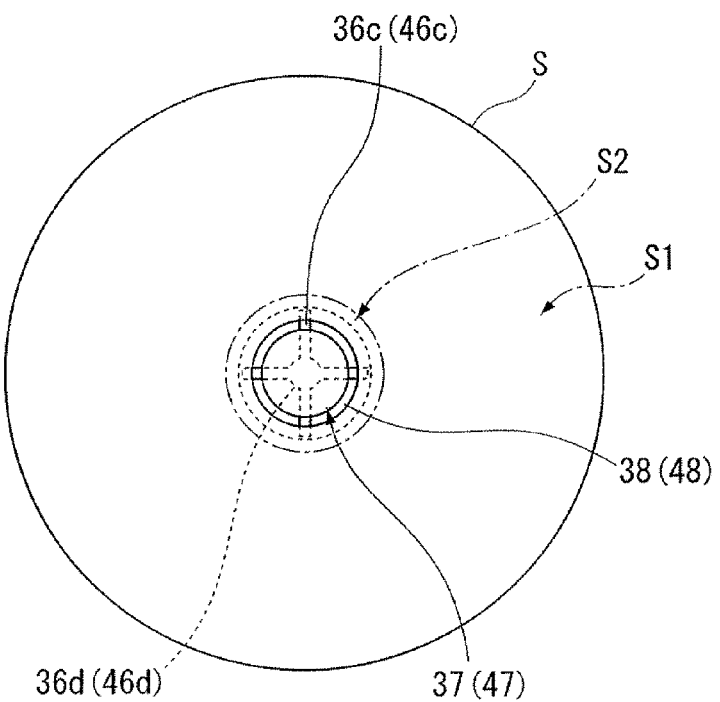
FIG. 13 is a view showing an operation of the substrate carrying device.

FIG. 12 is a sectional view showing the state where the holding portion 32 accesses the loading position LP. FIG. 13 is a view showing the state in FIG. 12 when viewed from the substrate S, that is, the opposite side of the holding portion 32. As shown in the drawings, when the holding portion 32 accesses the loading position LP, the absorbing surface 36e of the suction member 36 comes into contact with the substrate S, and the blocking member 37 is fitted into the opening Sa of the substrate S. The blocking member 37 is disposed inside the opening Sa, and blocks a part of the opening Sa so as to form a gap 38 between itself and the opening Sa.

After the access of the holding portion 32, the substrate processing unit SPU operates the suction pump 34a. By means of the operation of the suction pump 34a, the inside of the groove portion 36c is suctioned through the perforation holes 33e and 36d so that the pressure inside the groove portion 36c becomes negative. Since the pressure inside the groove portion 36c becomes negative, the substrate S and the blocking member 37 disposed on the groove portion 36c are pulled toward the absorbing surface 36e so that the substrate S is absorbed to the absorbing surface 36e and is held by the holding portion 32 so as to be upright in the Z direction.

In the operation, since the absorbing surface 36e of the suction member 36 comes into contact with the inside of an unprocessed portion S2 of the substrate S, the substrate S is suctioned without having an influence on a processed portion S1 of the substrate S. Since a part of the groove portion 36c protrudes from the opening Sa of the substrate S so as to be suspended on the surface of the substrate S, it is possible to reliably absorb the surface of the substrate S.

Even when the blocking member 37 is pulled toward the absorbing surface 36e, since a gap between the perforation hole 36d and the engagement portion 37b is in an open state, the suctioning operation is not disturbed. Since the blocking member 37 blocks the center of the opening Sa, the suctioning force efficiently acts on the substrate S compared with the case where the center is not blocked.

In the substrate processing unit SPU, after the substrate S is uprightly held by the holding portion 32, the holding force of the clamping members 23b and 24b is canceled so that the substrate S is held by only the holding portion 32. In this state, the substrate processing unit SPU withdraws the clamping members 23b and 24b, of which the holding force is canceled, in the −Z direction. After the clamping members 23b and 24b are withdrawn, the substrate processing unit SPU rotates the rotary table 30b of the loading carrying device SC1, and carries the substrate S to a coating position inside the coating device CT. At this time, the substrate S is held by the holding portion 32 so as to be upright in the Z direction.

Next, the coating operation of coating the liquid material on the substrate S will be described. In the coating operation, the coating device CT is used. The substrate processing unit SPU rotates the substrate S at a high speed in the state where the substrate is upright in the Z direction, allows nozzles 52 provided in the coating device CT to access a coating area of the substrate S, and then ejects the liquid material from the nozzles to the substrate S. In the embodiment, upon rotating the substrate S, the substrate S is held by the loading carrying device SC1 and the loading carrying device SC1 is used to rotate the substrate S.

In detail, the substrate processing unit SPU operates the motor device 33a in the state where the substrate S is disposed at the coating position 50. When the rotary shaft member 33b rotates by the operation of the motor device 33a, the holding portion 32 supported to the rotary shaft member 33b rotates together with the rotary shaft member 33b. According to this operation, the substrate S rotates while the substrate S is upright in the Z direction.

After the substrate S rotates in the state where the substrate S is upright in the Z direction, the substrate processing unit SPU allows the nozzle 52 on the +X and −X direction sides of the coating position 50 to access the substrate S, and ejects the liquid material from the nozzle 52 to the front and rear surfaces of the substrate S. The ejected liquid material equally spreads to the outer periphery of the substrate S by the centrifugal force caused by the rotation, thereby forming a thin film on both surfaces of the substrate S.

Since the nozzles 52 are disposed on the −Z direction side of the rotary axis of the substrate S, the nozzles 52 are disposed without contacting with the holding portion 32 and the arm portion 31. In addition, since the nozzles 52 eject the liquid material from the rotary axis of the substrate S to the outer periphery of the substrate S, the movement of the liquid material toward the center of the substrate S is suppressed.

The substrate processing unit SPU rotates an inner cup CP1 upon coating the liquid material on the substrate S by rotating the substrate S. In the liquid material ejected onto the substrate S, due to the rotation of the substrate S, the liquid material protrudes and flies from the substrate S, and is accommodated in an accommodation portion 53 through an opening formed in a facing portion 53a of the inner cup CP1. In the inside of the accommodation portion 53, due to the rotation of the inner cup CP1, the stream of the liquid material and gas occurs in the rotation direction. In accordance with the stream, the liquid material and gas are discharged to a discharge path through a discharging mechanism 54 connected to an outer cup CP2. The liquid material and gas discharged to the discharge path are divided by a trap mechanism 55, so that the gas passes through the trap mechanism 55 and the liquid material remains in the trap mechanism 55. The liquid material remaining in the trap mechanism 55 is discharged through a discharge portion (not shown).

After the coating operation, the substrate processing unit SPU makes the holding portion 42 of the unloading carrying device SC2 access the substrate S inside the coating device CT from the +X direction, and the holding portion 42 holds the substrate S. The operation of holding the substrate S using the holding portion 42 is the same as that of the case where the substrate S is held by the holding portion 32. According to this operation, one surface of the substrate S is held by the holding portion 32 of the loading carrying device SC1 and the other surface of the substrate S is held by the holding portion 42 of the unloading carrying device SC2.

After the substrate S is held by the holding portion 42, the substrate processing unit SPU stops the operation of the suction pump 34a so as to cancel the holding operation using the holding portion 32. According to this operation, since the substrate S is held by only the holding portion 42 of the unloading carrying device SC2, the substrate S is delivered from the loading carrying device SC1 to the unloading carrying device SC2.

Next, the peripheral edge removing operation of removing the thin film formed in the periphery of the substrate S will be described. In the peripheral edge removing operation, the peripheral edge removing device EBR is used. When the peripheral edge of the substrate S disposed inside the peripheral edge removing device EBR is dipped in a solution inside the dip portion and the substrate S rotates in this state, the thin film of the peripheral edge dipped in the solution is dissolved and removed. In the embodiment, in the peripheral edge removing operation, upon rotating the substrate S, the substrate S is held by the unloading carrying device SC2 and the unloading carrying device SC2 is used to rotate the substrate S. After the thin film of the peripheral edge is removed, the substrate processing unit SPU moves the peripheral edge of the substrate S to a gap between suction pads 58c of the suction portion 58b so as to suction the peripheral edge of the substrate S. According to the suctioning operation, the liquid material, the solution, or the like remaining in the peripheral edge of the substrate S is removed.

In detail, after the delivery operation of the substrate S, the substrate processing unit SPU rotates a rotary table 40b and appropriately expands or contracts an arm portion 41 so that the holding portion 42 accesses the peripheral edge removing device EBR. After the access, the substrate processing unit SPU moves the arm portion 41 or moves the dip portion so that the peripheral edge of the substrate S is dipped in the solution of the dip portion. In this state, the substrate processing unit SPU operates a motor device 43a of the unloading carrying device SC2. When a rotary shaft member 43b rotates by the operation of the motor device 43a, a suction member 46 supported to the rotary shaft member 43b moves together with the rotary shaft member 43b. According to the rotation, the thin film of the peripheral edge of the substrate S is removed.

After the peripheral edge removing operation, the substrate processing unit SPU moves the elevating member 25a so that the clamping member 25b of the substrate upper portion holding mechanism 25 is located on the +Z direction side of the unloading position UP. After the movement of the elevating member 25a, the substrate processing unit SPU rotates the rotary table 40b in the state where the substrate S is held by the holding portion 42 of the unloading carrying device SC2, and appropriately expands or contracts the arm portion 41 so that the holding portion 42 accesses the unloading position UP. According to this operation, the substrate S is disposed at the unloading position UP.

Next, the unloading operation of the substrate S will be described. After the substrate processing unit SPU checks that the substrate S is disposed at the unloading position UP, the substrate processing unit SPU moves the elevating member 25a of the substrate upper portion holding mechanism 25 in the −Z direction and the elevating member 26a of the substrate lower portion holding mechanism 26 in the +Z direction. According to this movement, the clamping member 25b mounted to the −Z-direction-side portion of the elevating member 25a comes into contact with the +Z-direction-side portion of the substrate S, and the clamping member 26b mounted to the +Z-direction-side end portion of the elevating member 26a comes into contact with the −Z-direction-side portion of the substrate S so that the +Z-direction-side portion and the −Z-direction-side portion of the substrate S are respectively held by the clamping members 25b and 26b.

After the substrate processing unit SPU checks that the substrate S is held by both the clamping members 25b and 26b, the substrate processing unit SPU stops the operation of the suction pump 44a of the unloading carrying device SC2 so as to cancel the operation of holding the substrate S using the holding portion 42. According to this operation, the substrate S is held by only the clamping members 25b and 26b. The substrate processing unit SPU simultaneously moves the elevating members 25a and 26a in the −Z direction in the state where the substrate S is held by the clamping members 25b and 26b. The substrate processing unit SPU moves the elevating mechanisms 25c and 26c in an interlocking manner so that the elevating members 25a and 26a move at the same speed. The substrate S is moved in the −Z direction in the state where the substrate S is held by the clamping members 25b and 26b.

When the protrusion of the elevating member 25a approaches the unloading cassette C2, the substrate processing unit SPU cancels the holding force using the clamping member 25b and stops the movement of the elevating member 25a so that only the elevating member 26a moves in the −Z direction. The substrate S is moved in the −Z direction in the state where the substrate S is held by the holding force using the clamping member 26b.

The substrate processing unit SPU maintains the operation of holding the substrate S using the clamping member 26b until the substrate S arrives at the accommodation position inside the unloading cassette C2. After the substrate S arrives at the accommodation position, the substrate processing unit SPU cancels the holding operation using the clamping member 26b, and moves the elevating member 26a in the −Z direction. According to this operation, the substrate S is accommodated in the unloading cassette C2.

In the description of the respective operations, the respective operations are sequentially performed on one sheet of substrate S accommodated on the farthest −Y direction side of the loading cassette C1, but actually, the respective operations are continuously performed on plural substrates S. In this case, the substrate processing unit SPU rotates the conveyor belt 20b and moves the loading cassette C1 in the −Y direction so that the substrate S disposed on the farthest −Y direction side of the rest of the substrates S accommodated in the loading cassette C1 is disposed at a position overlapping with the loading position LP in a plan view.

In the same manner, the substrate processing unit SPU rotates the conveyor belt 22b and moves the unloading cassette C2 in the −Y direction so that the accommodation position on the farthest −Y direction side of the accommodation positions inside the unloading cassette C2 is disposed at a position overlapping with the unloading position UP in a plan view. When the substrate processing unit SPU moves the loading cassette C1 and the unloading cassette C2, the substrate processing unit SPU repeats the above-described operations.

In the case where plural substrates S are processed, the substrate processing unit SPU simultaneously performs the processing operations on the plural substrates S. In detail, during the time when the coating operation is performed on a certain substrate S, the peripheral edge removing operation is performed on the other substrate S. In addition, the loading operation or the unloading operation is performed on another substrate S. In this manner, the operations are simultaneously performed on the plural substrates S. Thus, since the process operations are simultaneously performed, the standby time of the substrate S is reduced as much as possible, and hence the process tact time of the substrate S is reduced.

In the case where the processes of all the substrates S accommodated in the loading cassette C1 end, the loading cassette C1 is empty, and all accommodation positions of the unloading cassette C2 staying at the standby position P8 are filled with the processed substrates S. After the substrate processing unit SPU checks this state, the substrate processing unit SPU moves the loading cassette C1 from the standby position P4 to the standby position P2 by rotating the conveyor belt 20b in the inverse direction, and moves the loading cassette C1 to the standby position P3 by rotating the conveyor belt 20a. In the same manner, the substrate processing unit SPU moves the unloading cassette C2 from the standby position P8 to the standby position P6 by rotating the conveyor belt 22b in the inverse direction, and moves the unloading cassette C2 to the standby position P7 by rotating the conveyor belt 22a.

Next, a maintenance operation of a nozzle portion NZ and a cup portion CP of the coating device CT will be described. When the coating operation is repeated, solidified materials such as a liquid material or impurities such as chip or dust in the atmosphere may be adhered to the nozzle portion NZ or the cup portion CP. The impurities may block, for example, the nozzles 52 to thereby deteriorate the ejecting characteristic thereof or may block the discharge path inside the cup portion CP. In addition, in the ejecting operation, it is necessary to constantly manage the ejecting condition of the nozzles 52. Accordingly, it is necessary to periodically perform the maintenance operation of the nozzle portion NZ and the cup portion CP.

In the maintenance operation of the nozzle portion NZ, a nozzle managing mechanism NM is used. Upon cleaning the nozzles 52, the substrate processing unit SPU moves the nozzle portion NZ so that the nozzle managing mechanism NM accesses the nozzles 52. The substrate processing unit SPU cleans the front end of each nozzle 52 by moving the front end of the nozzles 52 in the cleaning liquid of a cleaning portion 57a.

After the cleaning operation, the substrate processing unit SPU moves the front end of the nozzle 52 to a gap between the suction pads 57d of the suction portion 57b, and suctions the front end of the nozzle 52. According to the suctioning operation, impurities such as the cleaning liquid remaining in the nozzle 52 are removed.

After the suctioning operation, the substrate processing unit SPU moves the front end of the nozzle 52 to the inside of a liquid receiving portion 57c. In the liquid receiving portion 57c, a preliminary ejecting operation of the nozzle 52 is performed. By preliminarily discharging the liquid material from the nozzle 52, the ejecting condition of the nozzle 52 is adjusted. After the substrate processing unit SPU moves the front end of the nozzle 52 to the inside of the liquid receiving portion 57c, the substrate processing unit SPU ejects the liquid material from the nozzle 52. The ejected liquid material is collected in the liquid receiving portion 57c, and is collected by a collecting mechanism (not shown).

The maintenance operation of the cup portion CP will be described. Upon cleaning the cup portion CP, cleaning liquid nozzle portions 56 are used. Upon performing the coating operation, the substrate processing unit SPU allows the cleaning liquid nozzle portions 56 instead of the nozzles 52 to access the +X-direction-side portion and the −X-direction-side portion of the substrate S while the substrate S rotates, and ejects the cleaning liquid from the cleaning liquid nozzle portions 56 to the substrate S. The cleaning liquid ejected onto the substrate S moves to the peripheral edge of the substrate S by the centrifugal force caused by the rotation, and flies from the peripheral edge of the substrate S to the inner cup CP1. The flying cleaning liquid is accommodated in the accommodation portion 53 through the opening of the facing portion 53a. At this time, in the substrate processing unit SPU, since the inner cup CP1 rotates, it is possible to cause a stream of the cleaning liquid inside the accommodation portion 53. Accordingly, it is possible to clean the inside of the accommodation portion 53 and the inside of the discharge path by the stream of the cleaning liquid. As in the case of discharging the liquid material, the cleaning liquid is divided by the trap mechanism 55 so as to be discharged separately from a gas.

The cleaning operation of the cup portion CP may be performed, for example, in the state where the facing portion 53a of the accommodation portion 53 is separated. Even in the case where the cleaning operation is not performed, for example, the facing portion 53a may be separated so as to separately clean the facing portion 53a, or the facing portion 53a may be separated so as to perform the maintenance operation of other portions of the cup portion CP.

Cassette Carrying Operation

Next, the cassette carrying operation in which the empty loading cassette C1 is carried to the substrate loading unit LDU and the unloading cassette C2 accommodating the processed substrate S is carried to the substrate unloading unit ULU will be described.

The operation of carrying the loading cassette C1 will be described. The carrying operation is performed by using the cassette carrying device CC used in the above-described carrying operation. The carrying unit CRU moves the cassette carrying device CC up to the loading buffer mechanism BF1 of the substrate processing unit SPU. The empty loading cassette C1 stays in a standby state at the standby position P3 inside the loading buffer mechanism BF1. The carrying unit CRU rotates the cassette support plate 72 so that the longitudinal direction of the cassette support plate 72 of the cassette carrying device CC aligns with the longitudinal direction of the loading cassette C1.

After the rotation of the cassette support plate 72, the carrying unit CRU performs a positioning operation between the X-direction position of the cassette carrying device CC and the X-direction position of the loading cassette C1. After the positioning operation, the carrying unit CRU allows the cassette carrying device CC to perform the transfer operation of the empty loading cassette C1 staying in a standby state at the standby position P3. The transfer operation is the same as the above-described transfer operation.

After the transfer operation of the loading cassette C1, the carrying unit CRU moves the cassette carrying device CC in the −X direction toward the substrate loading unit LDU, and rotates the cassette support plate 72 so that the longitudinal direction of the cassette support plate 72 aligns with the X direction. After the carrying unit CRU rotates the cassette support plate 72, the carrying unit CRU performs a positioning operation between the X-direction position of the cassette carrying device CC and the X-direction position of the collection belt 11b provided in the substrate loading unit LDU.

After the positioning operation, the carrying unit CRU places the empty loading cassette C1 placed on the cassette support plate 72 on the +Y-direction-side end portion of the collection belt 11b, and withdraws the cassette holding member 74 in the +Y direction. The placing operation and the withdrawing operation are the same as the above-described placing operation and the above-described withdrawing operation. According to theses operations, the loading cassette C1 transferred to the cassette carrying device CC is carried to the substrate carrying unit LDU.

The operation of carrying the unloading cassette C2 will be described. As in the carrying operation of the loading cassette C1, the carrying operation is performed by using the cassette carrying device CC. The carrying unit CRU moves the cassette carrying device CC in the X direction up to the unloading buffer mechanism BF2 of the substrate processing unit SPU. The unloading cassette C2 accommodating the processed substrate S stays in a standby state at the standby position P7 inside the unloading buffer mechanism BF2. The carrying unit CRU rotates the cassette support plate 72 so that the longitudinal direction of the cassette support plate 72 of the cassette carrying device CC aligns with the longitudinal direction of the unloading cassette C2.

After the rotation of the cassette support plate 72, the carrying unit CRU performs a positioning operation of the cassette carrying device CC so that the X-direction position of the cassette carrying device CC is equal to the X-direction position of the unloading cassette C2. After the positioning operation, the carrying unit CRU makes the cassette carrying device CC perform the transfer operation of the unloading cassette C2 staying in a standby state at the standby position P7. The transfer operation is the same as the transfer operation.

After the transfer operation, the carrying unit CRU moves the cassette carrying device CC in the +X direction toward the substrate unloading unit ULU, and rotates the cassette support plate 72 so that the longitudinal direction of the cassette support plate 72 aligns with the X direction. After the carrying unit CRU rotates the cassette support plate 72, the carrying unit CRU performs a positioning operation between the X-direction position of the cassette carrying device CC and the X-direction position of the collection belt 61b provided in the substrate unloading unit ULU.

After the positioning operation, the carrying unit CRU places the unloading cassette C2 placed on the cassette support plate 72 on the +Y-direction-side end portion of the collection belt 61b, and withdraws the cassette holding member 74 in the +Y direction. The placing operation and the withdrawing operation are the same as the above-described placing operation and the above-described withdrawing operation. According to these operations, the unloading cassette C2 transferred to the cassette carrying device CC is carried to the substrate unloading unit ULU.

Cassette Collecting Operation

Next, a cassette collecting operation of collecting the empty loading cassette C1 and the unloading cassette C2 accommodating the processed substrate S will be described.

After the substrate loading unit LDU checks that the empty loading cassette C1 is carried thereto, the substrate loading unit LDU moves the loading cassette C1 in the −Y direction by rotating the collecting belt 11b. During the movement in the −Y direction, for example, the loading cassette C1 may be moved straight to the cassette entrance 10, or the loading cassette C1 may be moved gradually by an amount in which the +Y-direction-side end portion of the collection belt 11b is empty.

In the case where the loading cassette C1 is moved straight to the cassette entrance 10, the loading cassette C1 is carried to the outside of the substrate loading unit LDU through the cassette entrance 10. The loading cassette C1 carried to the outside of the substrate loading unit LDU is collected by a collecting mechanism (not shown). Whenever the loading cassette C1 is carried to the substrate loading unit LDU, this operation is repeated.

In the case where the loading cassette C1 is gradually moved, for example, whenever the loading cassette C1 is carried to the substrate loading unit LDU, the loading cassette C1 may be moved so as to be deviated in the −Y direction by an amount corresponding to a space of one loading cassette C1. In the case where the loading cassette C1 disposed on the farthest −Y direction side arrives at the cassette entrance 10 by repeating the operation plural times, the collecting operation is performed by a collecting mechanism (not shown).

On the other hand, after the substrate unloading unit ULU checks that the unloading cassette C2 accommodating the processed substrate S is carried thereto, the substrate unloading unit ULU moves the unloading cassette C2 in the −Y direction by rotating the collection belt 61b. During the movement, as in the case of the substrate loading unit LDU, the unloading cassette C2 may be moved straight to the cassette entrance 60, or may be moved so as to be gradually deviated in the −Y direction. According to the movement, finally, the unloading cassette C2 is carried to the outside of the substrate unloading unit ULU through the cassette entrance 60. The unloading cassette C2 carried to the outside of the substrate unloading unit ULU is collected by a collecting mechanism (not shown).

Cassette Supplement Operation

In the above description, during the time when the process operations are performed by the substrate processing unit SPU, the loading cassette C1 is disposed at the standby position P4 of the loading buffer mechanism BF1, and the unloading cassette C2 is disposed at the standby position P8 of the unloading buffer mechanism BF2. At this time, the standby position P1 of the loading buffer mechanism BF1 and the standby position P5 of the unloading buffer mechanism BF2 are empty.

After the carrying unit CRU checks that the standby positions P1 and P5 are empty, the carrying unit CRU allows the cassette carrying device CC to carry the next loading cassette C1 and the unloading cassette C2 to the standby positions P1 and P5, respectively. The carrying unit CRU first moves the cassette carrying device CC up to the substrate loading unit LDU, and transfers the next loading cassette C1 thereto. After the transfer operation, the carrying unit CRU moves the cassette carrying device CC up to the loading buffer mechanism BF1, and places the transferred loading cassette C1 to the standby position P1. In the same manner, the carrying unit CRU moves the cassette carrying device CC to the substrate unloading unit ULU, and transfers the next unloading cassette C2 thereto. Then, the carrying unit CRU moves the cassette carrying device CC to the unloading buffer mechanism BF2, and places the unloading cassette C2 to the standby position P5.

After the transfer operation of the loading cassette C1 and the unloading cassette C2, the substrate processing unit SPU allows the conveyor belts 20a and 20b to be in a standby state until the process operations performed on the substrate S accommodated in the loading cassette C1 at the standby position P4 substantially end. When the process operations end, the substrate processing unit SPU moves the loading cassette C1 from the standby position P4 to the standby position P2 by rotating the conveyor belt 20b.

According to this operation, the loading cassette C1 accommodating the unprocessed substrate S stays in a standby state at the standby position P1, and the empty loading cassette C1 stays in a standby state at the standby position P2. When the substrate processing unit SPU rotates the conveyor belt 20a in this state, the loading cassette C1 at the standby position P2 moves to the standby position P3, and the loading cassette C1 at the standby position P1 moves to the standby position P2. Thus, the moving operation is efficiently performed. Accordingly, actually, in the case where the coating operation and the like are performed by the substrate processing unit SPU, it is desirable that the loading cassettes C1 stay in a standby state at the standby positions P1 and P2.

In the same manner, if the conveyor belt 22a is rotated when the unloading cassette C2 moves from the standby position P8 to the standby position P6, the unloading cassette C2 at the standby position P6 moves to the standby position P7, and the unloading cassette C2 at the standby position P5 moves to the standby position P6. Thus, even in the unloading buffer mechanism BF2, the moving operation is efficiently performed. Accordingly, actually, in the case where the coating operation and the like are performed by the substrate processing unit SPU, it is desirable that the unloading cassettes C2 stay in a standby state at the standby positions P5 and P6.

When the loading cassette C1 moves from the standby position P1 to the standby position P2, and the unloading cassette C2 moves from the standby position P5 to the standby position P6, the standby positions P1 and P5 are empty again. The next loading caste C1 and the next unloading cassette C2 may stay at the empty standby positions P1 and P5, respectively. Thus, whenever the standby positions P1 and P5 of the loading buffer mechanism BF1 and the unloading buffer mechanism BF2 are empty, the carrying unit CRU carries the loading cassette C1 from the substrate loading unit LDU and carries the unloading cassette C2 from the substrate unloading unit LDU.

As described above, according to the embodiment, since the cassette carrying device CC provided in the carrying unit CRU carries the loading cassette C1 between the loading position LP and the substrate loading unit LDU, and carries the unloading cassette C2 between the unloading position UP and the substrate unloading unit ULU, the carrying operation in different carrying areas can be performed by one cassette carrying device CC. For this reason, since the carrying process using the cassette carrying device CC can be unified, it is possible to simplify the constitution of the substrate processing system SYS, and to reduce the process tact time. In addition, according to the embodiment, since the loading cassette C1 and the unloading cassette C2 are separately used, it is advantageous in that it is possible to prevent the substrate S from being contaminated.

In addition, according to the embodiment, since the substrate loading unit LDU, the substrate processing unit SPU, and the substrate unloading unit ULU are arranged in a linear direction, the carrying path between the units can be set in the linear direction. Accordingly, it is possible to prevent the carrying path from being complicated, and to simplify the constitution of the substrate processing system SYS. In addition, according to the embodiment, since the substrate processing unit SPU is disposed between the substrate loading unit LDU and the substrate unloading unit ULU, the respective units are arranged in a direction along the stream of the carried substrate. Accordingly, it is possible to improve the efficiency of the process.

Further, in the embodiment, since the carrying unit CRU moves the cassette carrying device CC in a linear direction (X direction), it is possible to simplify the moving operation of the cassette carrying device CC. In addition, since plural cassette standby portions are provided in the substrate loading unit LDU and the substrate unloading unit ULU so that plural cassettes can stay in a standby state, it is possible to promptly process more substrates.

Since the substrate loading unit LDU moves the cassette standby portion for the loading cassette C1 to the carrying unit CRU by using the supply belt 11a and the collection belt 11b and the substrate unloading unit ULU moves the cassette standby portion for the unloading cassette C2 to the cassette entrance 60 by using the supply belt 61a and the collection belt 61b, it is possible to efficiently perform the supply operation and the collection operation of the loading cassette C1 and the unloading cassette C2.

Since the substrate processing unit SPU is provided with the loading buffer mechanism BF1 corresponding to the loading position LP and the unloading buffer mechanism BF2 corresponding to the unloading position UP, and plural cassettes C stay in a standby state at the buffer mechanisms, it is possible to promptly perform the loading operation and the unloading operation of the substrate S in the substrate processing unit SPU, and thus to improve the efficiency of the process. In addition, since the buffer mechanism BF includes the conveyor belts 20 and 22 for moving the standby position of the cassette C so that the standby position of the cassette C moves in accordance with the number of the substrates S remaining inside the cassette C, it is possible to improve the efficiency of the process. Since the standby positions are provided along the carrying direction (X direction) using the cassette carrying device CC, the distance between the cassette carrying device CC and each standby position is uniform. Since the distance is uniformly maintained, the cassette carrying device CC easily accesses the respective standby positions.

Since the substrate processing unit SPU includes the substrate loading mechanism 21 which lifts the substrate S from the loading cassette C1 and disposes the substrate S at the loading position LP, it is possible to promptly perform the substrate loading operation. In the same manner, since the substrate processing unit SPU includes the substrate unloading mechanism 27, it is possible to promptly perform the unloading operation of the substrate S.

Since the cassette carrying device CC includes the rotary mechanism which rotates the direction of the cassette support plate 72, even when the carrying direction is different from the direction of the cassette, it is possible to smoothly perform the carrying operation and the delivery operation. In addition, since the loading cassette C1 and the unloading cassette C2 are respectively provided with the engagement portions Cx, and the carrying device includes the cassette holding member 74 which engages with the engagement portion Cx so as to hold the loading cassette C1 and the unloading cassette C2, it is possible to reliably hold the loading cassette C1 and the unloading cassette C2.

Since the control unit CNU controls the carrying positions of the loading cassette C1 and the unloading cassette C2 in accordance with the process condition of the substrate S in the substrate processing unit SPU, it is possible to further efficiently perform the carrying operation.

The technical scope of the invention is not limited to the above-described embodiment, but may be appropriately modified into various forms without departing from the spirit of the invention.

In the above-described embodiment, the control unit CNU controls the carrying positions of the loading cassette C1 and the unloading cassette C2 in accordance with the process condition of the substrate S inside the substrate processing unit SPU, but the invention is not limited thereto. For example, during the overall operations of the substrate processing system SYS, the carrying positions may be controlled in the state where the carrying positions of the loading cassette C1 and the unloading cassette C2 and the carrying timing thereof are determined in advance.

In the above-described embodiment, the loading cassette C1 and the unloading cassette C2 are provided with the engagement portions Cx, and the cassette carrying device CC allows the holding portion 74a of the cassette holding member 74 to engage with the engagement portion Cx so as to hold the loading cassette C1 and the unloading cassette C2, but the invention is not limited thereto. For example, the cassette holding portion 74 may hold other portions such as a bottom portion of the loading cassette C1 and the unloading cassette C2.

In the above-described embodiment, the cassette carrying device CC includes the rotary mechanism which rotates the direction of the cassette support plate 72, but the invention is not limited thereto. For example, the direction of the cassette support plate 72 may be fixed. In this case, in the substrate processing system SYS, the cassette C is supplied, collected, and moved in the state where the longitudinal direction of the cassette C aligns with the longitudinal direction of the cassette support plate 72. Accordingly, it is possible to further simplify the operation of the cassette carrying device CC.

In the above-described embodiment, the substrate processing unit SPU includes the substrate loading mechanism 21 which lifts the substrate S from the loading cassette C1 and disposes the substrate S at the loading position LP, but the invention is not limited thereto. For example, the substrate loading mechanism 21 may have other constitutions. The same applies to the substrate unloading mechanism 27.

In the above-described embodiment, the buffer mechanism BF moves the standby position of the cassette C in the X direction, but the invention is not limited thereto. For example, the standby position of the cassette C may be moved in other directions. In addition, the standby position of the cassette C may be fixed.

In the above-described embodiment, the loading buffer mechanism BF1 and the unloading buffer mechanism BF2 are provided as the buffer mechanism BF, but the invention is not limited thereto. For example, any one of both buffer mechanisms BF may be provided. The number of buffer mechanisms BF is not limited, and the buffer mechanisms BF may be provided at one position.

In the above-described embodiment, the cassette standby portion for the loading cassette C1 is moved to the carrying unit CRU by using the supply belt 11a and the collection belt 11b, and the cassette standby portion for the unloading cassette C2 is moved to the cassette entrance 60 by using the supply belt 61a and the collection belt 61b, but the invention is not limited thereto. For example, any one of the cassette standby portions may be moved.

In the above-described embodiment, plural cassettes C stay in a standby state at the substrate loading unit LDU and the substrate unloading unit ULU, but the invention is not limited to thereto. For example, one cassette C may stay in a standby state at one unit. Accordingly, the invention may be applied to even the small substrate processing system SYS.

In the above-described embodiment, the carrying unit CRU moves the cassette carrying device CC in a linear direction (X direction), but the invention is not limited thereto. For example, the cassette carrying device CC may be moved in other plural directions or a curve direction.

Thus, when the carrying direction is set to various shaped directions instead of the linear direction, it is possible to improve the degree of freedom in design related to the arrangements of the respective units.

For example, in the above-described embodiment, the substrate processing unit SPU is disposed between the substrate loading unit LDU and the substrate unloading unit ULU, but the substrate loading unit LDU, the substrate unloading unit ULU, and the substrate processing unit SPU may be disposed at different positions.

In the above-described embodiment, the substrate processing unit SPU, the substrate loading unit LDU, and the substrate unloading unit ULU are arranged in a linear direction, but the invention is not limited thereto. For example, the units may be respectively disposed at summits of a rectangular triangle or a right triangle. That is, it is possible to arrange the units in various ways.

In the above-described embodiment, the coating process forming a thin film on the substrate S is mainly exemplified as the process performed by the substrate processing unit SPU, but the invention is not limited thereto. For example, a pre-process and a post-process of the coating process may be performed by the substrate processing unit. As the pre-process, for example, a process of irradiating ultraviolet ray to the substrate S, a process of cleaning the substrate S, and the like may be exemplified. As the post-process, a process of depressurizing the vicinity of the substrate S, a process of heating the substrate S, and the like may be exemplified.

In the above-described embodiment, the loading position LP and the unloading position UP are set in advance, and the substrate loading mechanism 21 and the substrate unloading mechanism 27 are arranged in accordance with the loading position LP and the unloading position UP. On the contrary, first, the positions of the substrate loading mechanism 21 and the substrate unloading mechanism 27 may be set, and the loading position LP and the unloading position UP may be set on the +Z direction side of the substrate lower portion holding mechanisms 24 and 26.

Further, in the above-described embodiment, the coating device CT is configured to eject the liquid material onto the substrate S by rotating the substrate S, but the invention is not limited thereto. For example, the invention may be applied to other types of coating devices, for example, a dipping coating device, a slit-nozzle coating device, or the like. In addition, as the coating device CT, the invention is not limited to a type in which a thin film is formed on one surface of the substrate S, but may adopt a type in which a thin film is formed on both surfaces of the substrate S.

According to the embodiment, since the holding portion 32 for suctioning and holding the substrate S is rotatable about the arm portion 31 provided in the base portion 30, it is possible to rotate the substrate S in the state where the substrate S is held by the holding portion 32. For this reason, even when the substrate S is rotated in the substrate processing area such as the coating device CT, the peripheral edge removing device EBR, and the like, it is not necessary to perform the delivery operation of the substrate S by between rotary mechanisms. Since a time required for the delivery operation of the substrate S is not spent, it is possible to promptly perform a process including the carrying operation of the substrate S and the process operation of the substrate S. Accordingly, it is possible to reduce the overall process tact time of the substrate processing system SYS, and thus to improve the throughput. In the embodiment, since the rotary mechanism 33 for rotating the holding portion 32 is mounted to the arm portion 31, it is possible to further decrease the size of the device.

According to the embodiment, in the case where the substrate S having the opening Sa is processed, since the groove portion 36c suctions the surface of the substrate S having the opening Sa, it is possible to obtain a wide process target area from the outer periphery of the substrate S to the portion suctioned by the groove portion 36c. In the embodiment, since the groove portion 36c is disposed so as to suction the unprocessed portion S2 of the substrate S, it is possible to suction the substrate S without having an influence on the processed portion SI of the substrate S.

According to the embodiment, since the holding portion 32 includes the blocking member 37 which is fitted into the opening Sa, at least a part of the opening Sa is blocked by the blocking member 37. Accordingly, it is possible to suction the substrate S without deteriorating the suctioning force even when an area including the opening Sa is suctioned, and thus to reliably hold the substrate S.

According to the embodiment, since the blocking member 37 is separably mounted to other portions of the holding portion 32, for example, when the blocking member 37 is not necessary, it is possible to separate the blocking member 37 from the other portions. In addition, for example, since plural blocking members 37 having different dimensions can be separately used, it is possible to handle the substrates S provided with openings Sa having different dimensions. Accordingly, it is possible to variously change the suctioning and holding type.

Further, according to the embodiment, since the thickness of the blocking portion 37a of the blocking member 37 is not more than that of the substrate S, it is possible to prevent the blocking portion 37a from protruding to the opposite surface of the absorbing surface of the substrate S. Accordingly, it is easy to dispose other members on the opposite surface of the absorbing surface of the substrate S.

The technical scope of the invention is not limited to the above-described embodiment, but may be appropriately modified into various forms without departing from the spirit of the invention.

For example, in the above-described embodiment, upon holding and rotating the substrate S using the holding portion 32 in the coating device CT, only one surface of the substrate S is held and rotated, but the invention is not limited thereto. For example, both surfaces of the substrate S may be held and rotated.

Figure 14:
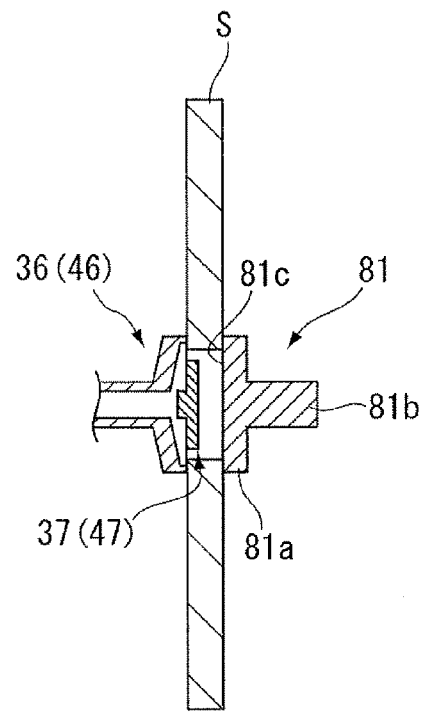
FIG. 14 is a view showing another constitution of the substrate carrying device according to the invention.

FIG. 14 is a view showing a type in which both surfaces of the substrate S are held and rotated, and shows the inner constitution of the coating device CT. As shown in the drawing, upon performing the coating operation, for example, a second holding portion 81 may be disposed inside the coating device CT so as to hold the opposite surface (hereinafter, referred to as the rear surface) of the surface of the substrate S held by the holding portion 32. In this constitution, the second holding portion 81 includes a contact portion 81a and a shaft portion 81b.

The contact portion 81a includes a contact surface 81c having the same dimension and shape as those of the absorbing surface 36e of the holding portion 32. The contact surface 81c is provided so as to come into contact with an area of the rear surface of the substrate S overlapping with the absorbing surface 36e. The shaft portion 81b is provided at the center of the contact portion 81a, and is rotatably supported by a support member (not shown). A pressing mechanism for pressing the shaft portion 81b against the substrate S may be separately provided.

In this constitution, when the substrate S rotates by the rotation of the holding portion 32, the rotation of the substrate S is transmitted to the second holding portion 81, and the second holding portion 81 rotates in a following manner. Since it is possible to hold the same area of the front and rear surfaces of the substrate S, it is possible to reliably prevent the substrate S from coming off from the holding portion 32 even when the substrate S is rotated. When the pressing mechanism is provided, it is possible to support both surfaces of the substrate S, and thus to further reliably prevent the substrate S from coming off therefrom.

Figure 15:
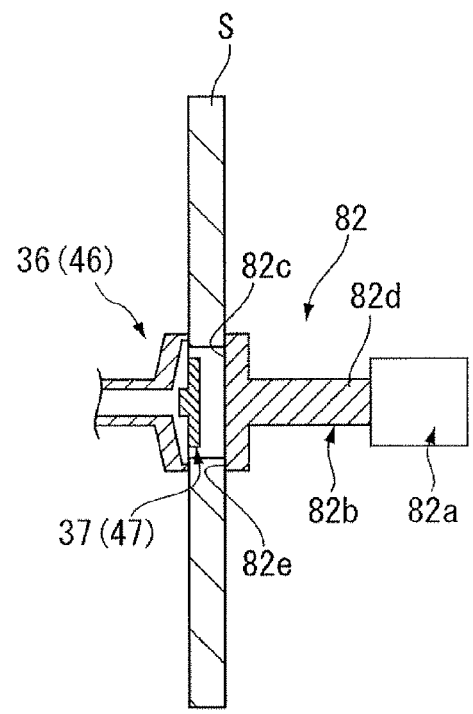
FIG. 15 is a view showing still another constitution of the substrate carrying device according to the invention.

FIG. 15 is a view showing another type in which both surfaces of the substrate S are held and rotated, and shows the inner constitution of the coating device CT. As shown in the drawing, a rotary holding portion 82 may be provided inside the coating device CT so as to hold the rear surface of the substrate S and to rotate itself whenever performing the coating operation. In this constitution, the rotary holding portion 82 includes a motor device 82a and a rotary holding member 82b.

The motor device 82a is a device which applies the rotation force to the rotary holding member 82b, and has the same driving force as that of the motor device 33a of the holding portion 32. The RPMs of the motor devices 33a and 82a are controlled by the control unit CNU or the like. The rotary holding member 82b includes a contact portion 82c and a shaft portion 82d.

As in the contact portion 81a shown in FIG. 14, the contact portion 82c includes a contact surface 82e having the same dimension and shape as those of the absorbing surface 36e (see FIG. 7) of the holding portion 32. The contact surface 82e is provided so as to come into contact with an area of the rear surface of the substrate S overlapping with the absorbing surface 36e. The shaft portion 82d is provided at the center of the contact portion 82c, and the end portion thereof is connected to the motor device 82a. A pressing mechanism for pressing the shaft 82d against the substrate S may be separately provided.

In this constitution, both surfaces of the substrate S can be held by the absorbing surface 36e and the contact surface 82e, the holding portion 32 is rotated by driving the motor device 33a, and the contact portion 82c is rotated by the motor device 82a so as to supply the rotation driving force to both surfaces of the substrate S, thereby reducing a load of the motor device 33a. When the pressing mechanism is provided, since it is possible to support both surfaces of the substrate S and to rotate both surfaces thereof, it is possible to further improve the rotation precision of the substrate S.

The constitution shown in FIGS. 14 and 15 is valid in the case of performing the coating operation inside the coating device CT, but the invention is not limited thereto. For example, the constitution inside the peripheral edge removing device EBR may be the same as the constitution shown in FIGS. 14 and 15. Accordingly, even in the unloading carrying device SC2, in the same manner as described above, it is possible to further reliably prevent the substrate S from coming off from the holding portion and to prevent the load of the motor 43a.

In the constitution shown in FIGS. 14 and 15, the absorbing surface 36e for absorbing the substrate S and the contact surface 81c of the second holding portion 81 or the absorbing surface 36e and the contact surface 82e of the rotary holding portion 82 are used to hold both surfaces of the overlapping portion of the substrate S, but the invention is not limited thereto. For example, the front and rear surfaces of the substrate S may be held at different positions.

Further, in the constitution shown in FIGS. 14 and 15, the second holding portion 81 and the rotary holding portion 82 are disposed inside the coating device CT, but the invention is not limited thereto. For example, the second holding portion 81 and the rotary holding portion 82 may be disposed outside the coating device CT so as to access the inside of the coating device CT as occasion demands.

In addition, the unloading carrying device SC2 may perform the above-described operations in stead of the second holding portion 81 and the rotary holding portion 82. In this case, it is possible to obtain the same advantage as that of the second holding portion 81 by stopping the operation of the motor device 43a of the unloading carrying device SC2. Further, it is possible to obtain the same advantage as that of the rotary holding portion 82 by operating the motor device 43a of the unloading carrying device SC2.

In the case where the unloading carrying device SC2 is used, since it is not necessary to perform the operation of holding the substrate S using the unloading carrying device SC2 after the coating operation of the substrate S ends, it is possible to shorten the operation of delivering the substrate S from the loading carrying device SC1 to the unloading carrying device SC2. For this reason, it is possible to further reduce the process tact time, and thus to further improve the throughput.

As described, according to the embodiment, since it is possible to eject the liquid material from the nozzles 52 to both surfaces of the substrate S rotating in an upright state, it is possible to allow the liquid material coating conditions at the front and rear surfaces of the substrate S to be more similar to each other. Since the front and rear surfaces of the substrate S are closer to the liquid material used to coat the surfaces thereof, it is possible to prevent a difference in the state of the thin film formed by the liquid material coated on the substrate S. Accordingly, it is possible to improve the state of the liquid material coated on the substrate S.

Regarding the nozzle portion NZ, when the nozzle 52 is configured to eject the liquid material from the center of the substrate S to the outer periphery thereof, the ejecting direction of the nozzle 52 is equal to the direction of the centrifugal force acting on the substrate S. Accordingly, it is possible to further efficiently apply the liquid material. In the embodiment, since the nozzle 52 is bent from the center thereof to the outer periphery thereof, it is possible to adjust the ejecting direction of the liquid material with a simple constitution without separately providing an adjusting mechanism or the like for adjusting the ejecting direction of the liquid material.

Since an ejecting surface 52a of the front end of the nozzle 52 is inclined relative to the ejecting direction of the liquid material, it is possible to reduce the surface tension of the liquid material in the front end of the nozzle 52. Accordingly, the liquid material hardly remains in the front end of the nozzle 52. In addition, when the nozzle 52 is provided below the rotary shaft of the substrate carrying mechanism SC, it is possible to allow the ejecting direction of the liquid material to align with the direction of gravity. Accordingly, the liquid material easily spreads on the substrate S.

When the nozzles 52 are disposed at the same positions of the front and rear surfaces of the substrate S, it is possible to allow the coating conditions at the front and rear surfaces of the substrate S to be equal to each other. Accordingly, it is possible to uniformly apply the liquid material on both surfaces of the substrate S. In addition, since the moving mechanism 51 for moving the nozzle 52 is provided, it is possible to move the position of the nozzle 52 in accordance with the process condition of the coating device CT. Accordingly, it is possible to perform the coating operation in a wider range.

Regarding the nozzle managing mechanism NM, since the nozzle managing mechanism NM includes the cleaning portion 57a which cleans the front end of the nozzle 52 by dipping the front end of the nozzle 52 in the cleaning liquid, it is possible to clean and remove the liquid material adhered to the front end of the nozzle 52. When the liquid material is adhered to the front end of the nozzle 52, the nozzle 52 is blocked, which causes deterioration in the ejecting performance. In the invention, it is possible to prevent the deterioration in the ejecting performance by cleaning the front end of the nozzle 52. In addition, since the nozzle managing mechanism NM includes the suction portion 57b which suctions the front end of the nozzle 52, it is possible to remove the liquid material adhered to the front end of the nozzle 52 or to remove the cleaning liquid or the like used to clean the liquid material from the front end of the nozzle 52. Accordingly, it is possible to manage the front end of the nozzle 52 in a cleaner state. In addition, since the nozzle managing mechanism NM includes the liquid receiving portion 57c which receives the liquid material preliminarily ejected from the nozzle 52, it is easy to perform the preliminary liquid material ejecting operation. Accordingly, it is possible to prevent the deterioration in the ejecting performance of the nozzle 52.

Regarding the cup portion CP, since the cup portion CP includes the accommodation portion 53 which accommodates the liquid material, it is possible to collect the flying liquid material in the accommodation portion 53. Accordingly, it is possible to efficiently manage the flying liquid material. In addition, since the facing portion 53a of the cup portion CP facing the side portion of the substrate S is separably mounted to other portions of the cup portion CP, it is easy to perform the maintenance of the cup portion CP. Accordingly, it is easy to clean the cup portion CP. In addition, since the adjusting mechanism 53b for adjusting the opening dimension of the facing portion 53a is provided, it is possible to flexibly handle the cases in which the coating process conditions such as the thickness of the substrate S or the flying degree of the liquid material are different.

In addition, the cup portion CP may includes the inner cup CP1 and the outer cup CP2, and the inner cup CP1 may be provided with a rotary mechanism 53c which rotates the inner cup CP1 in a direction along the outer periphery of the substrate S. In this case, it is possible to rotate the inner cup CP1 without rotating the entire part of the cup portion CP. In addition, when the accommodation portion 53 is connected to the discharging mechanism 54 which discharges at least one of the liquid material and gas inside the accommodation portion 53, it is possible to discharge the liquid material inside the accommodation portion 53 by using the discharging mechanism 54 and to form a stream of the gas inside the accommodation portion 53. In addition, when the inner cup CP1 is formed in a circular shape and the discharging mechanism 54 is provided along the tangential direction of the outer periphery of the inner cup CP1, it is possible to discharge the liquid material along the rotation direction of the substrate S. When the trap mechanism 55 is disposed in the discharge path of the discharging mechanism 54, it is easy to handle the liquid material.

When a cleaning liquid nozzle portion 56 which ejects the cleaning liquid cleaning the cup portion CP to the substrate S is further provided, it is possible to allow the cleaning liquid ejected onto the substrate S to fly to the accommodation portion 53 inside the inner cup CP1 by the rotation of the substrate S. Accordingly, it is possible to efficiently clean the cup portion CP.

Regarding the peripheral edge removing device EBR, when a removing portion 58a which removes the liquid material by dipping the outer periphery of the substrate S in the solution is provided, it is possible to efficiently remove the liquid material coated on the outer periphery. In addition, when a suction portion 58b which suctions the outer periphery of the substrate S is provided, and it is possible to promptly remove the liquid material or the solution adhered to the outer periphery of the substrate S.

The technical scope of the invention is not limited to the above-described embodiment, but may be appropriately modified into various forms without departing from the spirit of the invention.

For example, in the above-described embodiment, the nozzle portion 56 is provided as the nozzle for ejecting the cleaning liquid used to clean the cup portion CP, but the invention is not limited thereto. For example, as the cleaning liquid nozzle, the nozzle 52 may be commonly used. In this case, a changing mechanism (not shown) which changes the supply source of the nozzle 52 to the liquid material or the cleaning liquid is provided. Accordingly, it is possible to efficiently perform the maintenance without complicating the constitution of the device.

In the above-described embodiment, the position of the nozzle portion NZ is disposed on the −Z direction side of the rotary axis of the substrate S, and the liquid material is ejected along the direction of the gravity, but the invention is not limited thereto. For example, the position of the nozzle portion NZ may be disposed on the +Z direction side of the rotary axis of the substrate S so as to eject the liquid material in a direction opposite to the direction of the gravity.

In the above-described embodiment, the nozzle 52 is bent at a bent portion 52b, but the invention is not limited thereto. For example, the nozzle 52 may be formed in a curved shape toward the −Z direction of the rotary axis of the substrate S. In this case, it is possible to smoothly communicate the liquid material.

In the above-described embodiment, the nozzles 52 are disposed at the same positions of the front and rear surfaces of the substrate S, but the invention is not limited thereto. For example, the nozzles 52 may be disposed at different positions of the front and rear surfaces thereof For example, one of the nozzles 52 may be disposed on the −Z direction side of the rotary axis of the substrate S relative to the +X-direction-side portion of a coating position 50, and another nozzle 52 may be disposed on the +Z direction side of the rotary axis of the substrate S relative to the −X-direction-side portion of the coating position 50. Of course, the arrangement in the +Z direction side may be changed to the arrangement in the −Z direction side, and the arrangement in the −Z direction side may be changed to the arrangement in the +Z direction side.

In the above-described embodiment, the nozzle managing mechanism NM is disposed on the +Y direction side of the nozzle portion NZ, but the invention is not limited thereto. The nozzle managing mechanism NM may be disposed at a different position within a movable range of the nozzle portion NZ.

In the above-described embodiment, upon cleaning the inside of the cup portion CP, the cleaning liquid is ejected to the substrate S by using the cleaning liquid nozzle portion 56, but the invention is not limited thereto. For example, a cleaning liquid ejecting substrate different from the substrate S may be disposed at the coating position 50 so as to eject the cleaning liquid to the cleaning liquid ejecting substrate. Accordingly, it is possible to suppress the substrate S from being used for other purposes, instead of forming the thin film.

Figure 23:
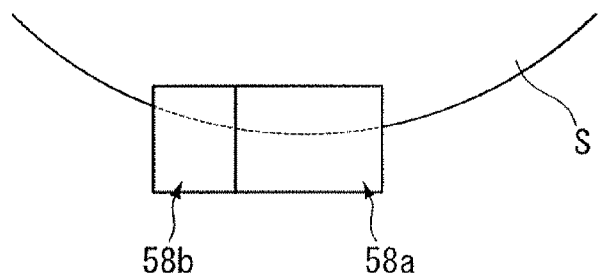
FIG. 23 is a view showing another constitution of the peripheral edge removing mechanism.

In the above-described embodiment, in the constitution of the peripheral edge removing mechanism EBR, the removing portion 58a and the suction portion 58b are disposed in a direction perpendicular to the substrate surface of the substrate S, but the invention is not limited thereto. For example, as shown in FIG. 23, the removing portion 58a and the suction portion 58b may be arranged on the substrate surface. In this constitution, it is possible to simultaneously dispose the peripheral portion of one sheet of substrate S inside the removing portion 58a and the suction portion 58b. Accordingly, it is possible to remove and suction the peripheral portion by rotating the substrate S, and thus to reduce the process tact time.

In the above-described embodiment, the arm portions 31 and 41 of the substrate carrying device SC are adapted to be movable in a direction parallel to the XY plane, but the invention is not limited thereto. For example, the arm portions 31 and 41 may be adapted to be movable in the Z direction. This constitution can be realized by disposing a separate driving mechanism inside the arm portions 31 and 41. Accordingly, since the movable ranges of the arm portions 31 and 41 are widened, it is possible to widen the access areas of the holding portions 32 and 42. Accordingly, it is possible to perform various operations.

In the above-described embodiment, the moving mechanism 35 for moving the arm portions 31 and 41 or the rotary mechanism 33 for rotating the holding portions 32 and 42 are disposed inside the arm portions 31 and 41, but the invention is not limited thereto. The moving mechanism 35 or the rotary mechanism 33 may be disposed outside the arm portions 31 and 41. Accordingly, it is possible to slim the arm portions 31 and 41, and thus to reduce the load during the substrate carrying operation.

In the above-described embodiment, the thickness of the blocking member 37 is formed to be thinner than that of the substrate S, but the invention is not limited thereto. The blocking member 37 may be formed so that the thickness of the blocking member 37 is equal to the thickness of the substrate S. Even in this case, it is possible to obtain the same advantage as that of the above-described embodiment.

In the above-described embodiment, the blocking member 37 is separably mounted to the suction member 36, but the invention is not limited thereto. For example, the blocking member 37 may be incorporated into the suction member 36. In this case, it is not necessary to perform a process of separating the blocking member 37 from the suction member 36. In addition, it may not be necessary to provide the blocking member 37.

In the above-described embodiment, the groove portion 36c provided in the absorbing surface 36e of the absorbing portion 36a is formed in a cross shape when viewed from the front side of the groove portion 36c, but the invention is not limited thereto. That is, the groove portion 36c may be formed in other shapes. In this case, it is desirable that the groove portion 36c is disposed so as to overlap with the surface of the substrate S in the state where the suction surface 36e comes into contact with the substrate S. Accordingly, it is possible to reliably suction the surface of the substrate S, and thus to improve the absorbing precision.

In the above-described embodiment, the substrate carrying devices SC are disposed at two positions of the substrate processing unit SPU, but the invention is not limited thereto. For example, the substrate carrying device(s) SC may be disposed at one position, or may be disposed at three or more positions.

In the above-described embodiment, the substrate loading unit LDU includes the belt conveyor mechanism as the cassette moving mechanism 11, but the invention is not limited thereto. Instead of the belt conveyor mechanism, for example, a hook member which holds the engagement portion Cx of the loading cassette C1 may be provided. The hook member, for example, may have the same constitution as that of the cassette holding member 74 of the cassette carrying device CC. In the state where the engagement portion Cx of the loading cassette C1 is held by the hook member, the loading cassette C1 may be moved inside the substrate loading unit LDU. The hook member may be used as the cassette moving mechanism 61 of the substrate unloading unit ULU. Instead of the hook member, for example, other carrying mechanisms such as a rail mechanism, a linear motor, and an air cylinder may, of course, be used.

In the above-described embodiment, in the loading buffer mechanism BF1 and the unloading buffer mechanism BF2, the conveyor belts 20a, 20b, 22a, and 22b are used as the moving mechanism for moving the standby positions of the loading cassette C1 and the unloading cassette C2, but the invention is not limited thereto. For example, in the loading buffer mechanism BF1, a moving mechanism may be provided which moves the loading cassette C1 in a sequential order of the standby positions P1, P2, P4, P2, and P3. Even in the buffer mechanism BF2, in the same manner, a moving mechanism may be provided which moves the unloading cassette C2 in a sequential order of the standby positions P5, P6, P8, P6, and P7.

The moving mechanism, for example, may include a hook member which holds the engagement portions Cx of the loading cassette C1 and the unloading cassette C2. In the same manner as described above, for example, the hook member may have the same constitution as the cassette holding member 74 of the cassette carrying device CC.

In the above-described embodiment, the substrate carrying devices SC are disposed at two positions inside the substrate processing unit SPU, but the invention is not limited thereto. For example, the substrate carrying device(s) SC may be disposed at one position, or may be disposed at three or more positions.

In the above-described embodiment, the cassette C accommodates the substrate S so as to be upright in the Z direction, and carries the substrate S in an upright state, but the invention is not limited thereto. The cassette C may accommodate the substrate S in the state where the substrate surface of the substrate S is parallel to the XY plane, and may carry the substrate S in this state.

In the above-described embodiment, the loading carrying device SC1 and the unloading carrying device SC2 are configured to individually hold and rotate the substrate S, but the invention is not limited thereto. For example, in the loading carrying device SC1 and the unloading carrying device SC2, both surfaces of one sheet of substrate S may be held and rotated. In this case, one of the loading carrying device SC1 and the unloading carrying device SC2 may rotate mainly, and the other thereof may be rotated in the following manner. Alternatively, both the loading carrying device SC1 and the unloading carrying device SC2 may rotate mainly. When both surfaces of the substrate S are held by the loading carrying device SC1 and the unloading carrying device SC2, it is possible to allow the front and rear surfaces of the substrate S to be in the same state related to an air stream or the like as much as possible. By adjusting the states of both surfaces of the substrate S, it is possible to prevent the difference in the quality of the film coated on both surfaces of the substrate S.

In the above-described embodiment, the peripheral edge removing device EBR is disposed on the side of only the unloading carrying device SC2, but the invention is not limited thereto. For example, the peripheral edge removing device EBR may be disposed on the side of the loading carrying device SC1 (a portion depicted by the dashed line in FIG. 1). With such a constitution, for example, the coating operation and the peripheral edge removing operation may be performed on both the loading carrying device SC1 and the unloading carrying device SC2.

For example, during the time when the coating operation is performed by the loading carrying device SC1, the peripheral edge removing operation may be performed by the unloading carrying device SC2. On the contrary, during the time when the peripheral edge removing operation is performed by the loading carrying device SC1, the coating operation may be performed by the unloading carrying device SC2. Likewise, since it is possible to perform the parallel process by allowing two substrate carrying devices SC to alternately access the coating device CT, it is possible to efficiently perform the process operations, and thus to further reduce the process tact time.

In addition, as described above, in the case where one sheet of substrate S is simultaneously held and rotated by each of the loading carrying device SC1 and the unloading carrying device SC2, the peripheral edge removing device EBR may be disposed inside the coating device CT. With this constitution, the coating operation is performed in the state where the substrate S is held and rotated by each of the loading carrying device SC1 and the unloading carrying device SC2, and the peripheral edge removing operation is continuously performed after the coating operation. Accordingly, since the coating operation and the peripheral edge removing operation are performed by one device, it is possible to improve the efficiency of the process. In addition, since the coating operation and the peripheral edge removing operation are performed by one coating device CT, for example, after performing the coating operation and the peripheral edge removing operation on one sheet of substrate S, the next substrate S to be processed can be loaded by the loading carrying device SC1 in the state where the one sheet of substrate S is unloaded by the unloading carrying device SC2. Since it is possible to simultaneously perform the loading operation using the loading carrying device SC1 and the unloading operation using the unloading carrying device SC2, it is possible to efficiently perform the process operation.

In addition to the constitution of the above-described embodiment, the substrate processing system SYS, for example, may further include a foreign material detecting unit which detects a foreign material existing on the substrate S subjected to the coating process. When a foreign material is adhered to the substrate S subjected to the coating process, the foreign material adhered portion of the substrate S may be damaged upon performing the next process, for example, the imprinting process. On the contrary, when the foreign material detecting unit is further provided so as to detect whether the foreign material exists on the substrate S subjected to the coating process, it is possible to detect the substrate S to which the foreign material is adhered. Accordingly, since it is possible to prevent the substrate S from being used for the next imprinting process, it is possible to prevent the substrate S from being damaged.

In addition, in the case where the substrate processing system SYS includes the foreign material detecting unit, the foreign material detecting unit may be disposed as a unit which is independent from the stage unit STU, the substrate processing unit SPU, the substrate loading unit LDU, the substrate unloading unit ULU, and the carrying unit CRU. For example, the foreign material detecting unit may be disposed inside the substrate processing unit SPU. Although it is desirable that the foreign material detection is performed before the substrate S subjected to the coating process is accommodated in the unloading cassette C2, the foreign material detection may be, of course, performed in the state where the substrate S is accommodated in the unloading cassette C2. In the case where the foreign material detection is performed before the substrate S is accommodated in the unloading cassette C2, for example, a collecting mechanism may be provided which separately collects the substrate S in which a foreign material is detected and prevent the substrate S from being collected in the unloading cassette C2.

In the case where the peripheral edge removing device EBR is disposed inside the coating device CT, for example, a peripheral edge removing nozzle having the same shape as that of the nozzle used for coating the liquid material may be separately disposed inside the coating device CT, and the solution of the liquid material may be ejected from the peripheral edge removing nozzle. In addition, the solution nozzle may be commonly used with the cleaning liquid nozzle portion 56. In this case, the supply source of the solution is connected to the cleaning liquid nozzle portion 56, and one of the supply sources of the cleaning liquid and the solution is selected to eject the cleaning liquid or the solution, thereby ejecting both the cleaning liquid and the solution from the same cleaning liquid nozzle portion 56.

Figure 24A:
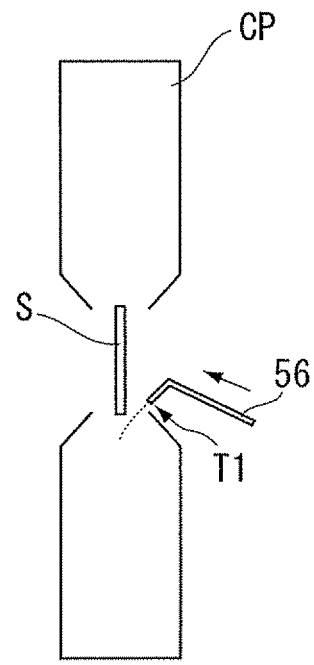
FIGS. 24A and 24B are views showing another constitution of a coating device according to the invention.
Figure 24B:
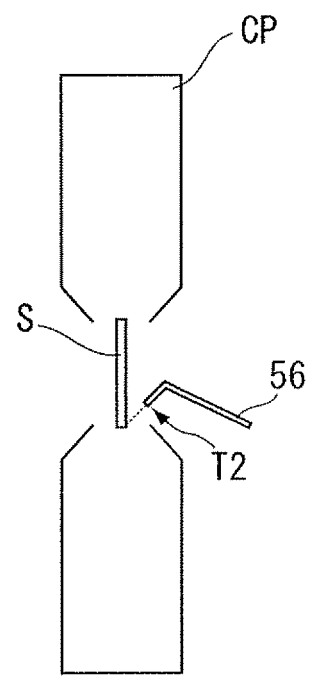

In the case where the solution is ejected from the cleaning liquid nozzle portion 56, for example, as shown in FIG. 24A, the control unit CNU ejects the solution from the cleaning liquid nozzle portion 56 at a position T1 where the solution does not contact with the substrate S. Subsequently, as shown in FIG. 24B, the control unit CNU moves the cleaning liquid nozzle portion 56 to a position T2 where the solution is ejected to the substrate S in the state where the solution is ejected, and ejects the solution to the peripheral edge of the substrate S at the ejecting position T2. According to theses operations, it is possible to prevent the solution from flowing from the cleaning liquid nozzle portion 56 from flying to the center of the substrate S, and thus to improve the precision of adjusting the coating state of the outer periphery of the substrate S.

In addition, in the case where both surfaces of one substrate S are held and rotated by the loading carrying device SC1 and the unloading carrying device SC2, for example, the loading carrying device SC1 may suction the substrate S, and the unloading carrying device SC2 may press the substrate S.

Figure 16:
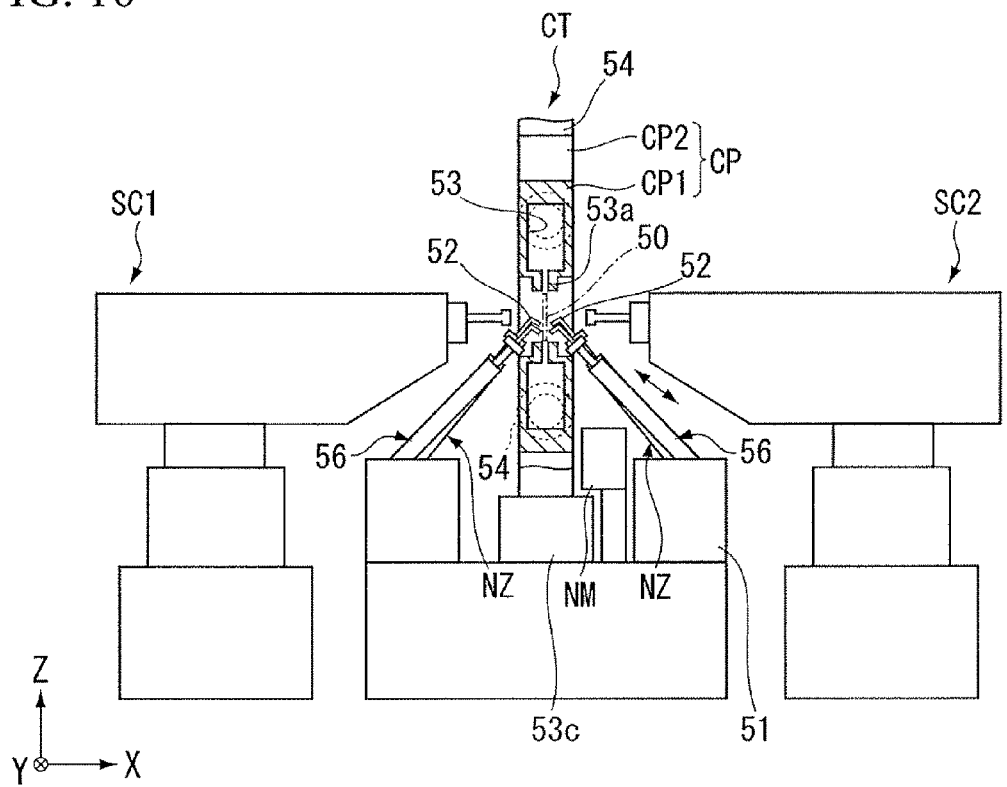
FIG. 16 is a view showing a constitution of a coating device and a substrate processing unit of the substrate carrying device according to the invention.
Figure 17:
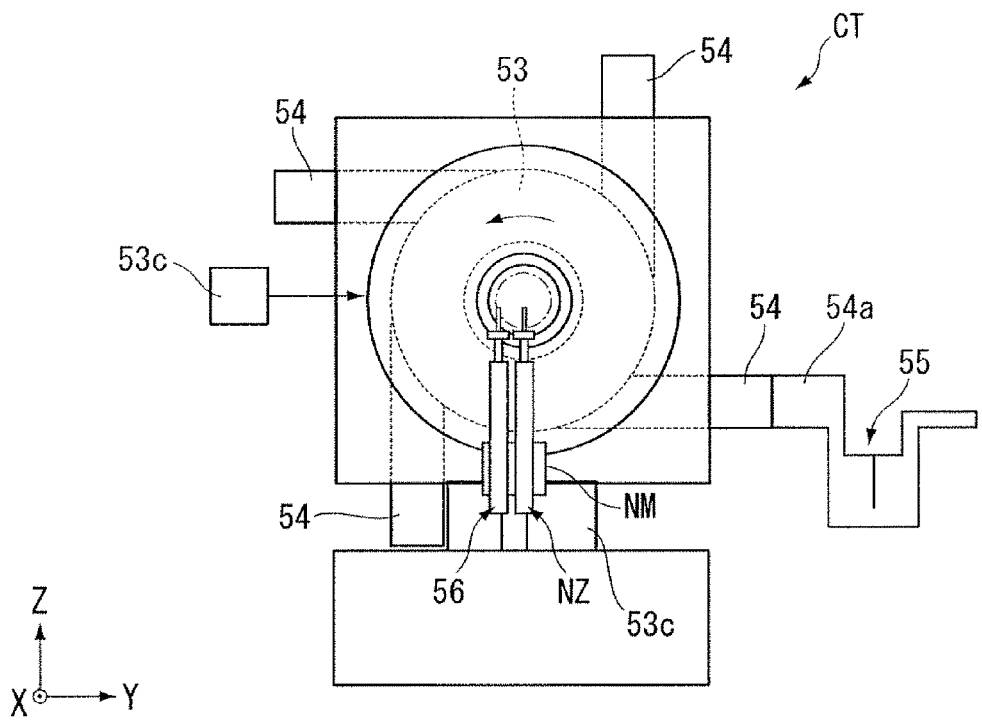
FIG. 17 is a front view showing a constitution of the substrate processing unit.
Figure 18:
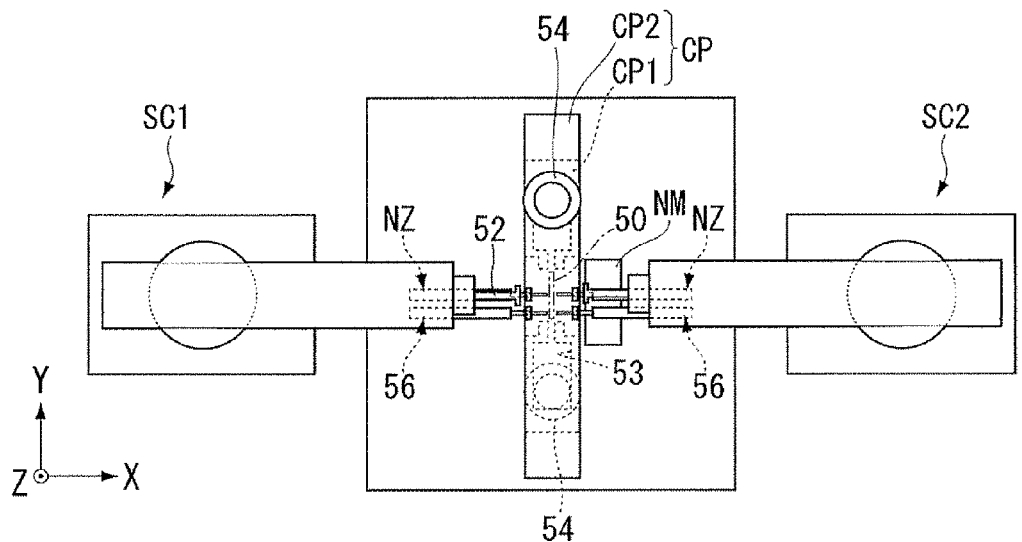
FIG. 18 is a side view showing the constitution of the substrate processing unit.

FIGS. 16 to 18 are views showing the constitution of the coating device CT. The coating device CT includes the nozzle portion NZ, the cup portion CP, and the nozzle managing mechanism NM.

The nozzle portions NZ are provided so as to access the center in the Y direction of the coating position 50 by using the nozzle moving mechanism 51. The nozzle portions NZ are respectively disposed on the +X direction side and the −X direction side of the coating position 50. Each nozzle portion NZ includes the nozzle 52 which ejects the liquid material as a material forming the thin film onto the substrate S. The nozzle 52 is bent at the bent portion 52b so as to eject the liquid material from the center of the substrate S to the outer periphery thereof when the nozzle accesses the coating position. The nozzle 52 is provided on the −Z direction side of the rotary axis of the substrate S. The nozzles 52 are disposed at the same positions of the front surface (+X direction side) and the rear surface (−X direction side) of the substrate S relative to the coating position 50 so as to be symmetric to each other in the X direction.

Figure 19:
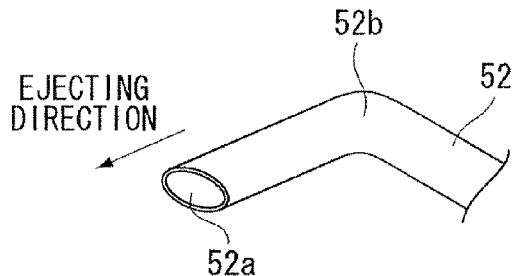
FIG. 19 is a view showing a constitution of a front end of a nozzle.

As shown in FIG. 19, the ejecting surface 52a of the front end of the nozzle 52 is inclined relative to the ejecting direction of the liquid material. Since the front end of the nozzle 52 is sharp, for example, it is possible for the liquid material to neatly run out from the nozzle upon stopping the coating operation using the liquid material.

The cup portion CP includes the inner cup CP1 and the outer cup CP2. The inner cup CP1 is formed in a circular shape when viewed in the X direction, and is disposed so as to surround the side portion of the substrate S disposed at the coating position 50. The outer cup CP2 is formed in a square shape when viewed in the X direction, and supports the outside portion of the inner cup CP1. The outer cup CP2 is fixed to the upper surface of the stage unit STU through, for example, a support member or the like.

In the embodiment, the inner cup CP1 and the outer cup CP2 are integrally formed with each other, but may, of course, be separated from each other.

The inner cup CP1 includes an accommodation portion 53 which accommodates the liquid material. The accommodation portion 53 is provided with the discharging mechanism 54 which discharges at least one of the liquid material and gas inside the accommodation portion 53. The discharging mechanism 54 is provided along the tangential direction of the outer periphery of the inner cup CP 1 formed in a circular shape. The discharging mechanism 54 is connected to the accommodation portion 53 of the inner cup CP 1 through the outer cup CP2. As shown in FIG. 17, for example, the discharging mechanism 54 is provided in each of four edges of the outer cup CP2, where the number of discharging mechanisms 54 is four in total. As shown in FIG. 17, each discharging mechanism 54 is connected to each discharge path. Each discharge path is provided with the trap mechanism 55 which is a gas-liquid separating mechanism for separating a gas and a liquid. In addition, the discharge path and the trap mechanism 55 for other discharge mechanisms 54 shown in FIGS. 16 to 18 are not shown in the drawing.

Figure 20:
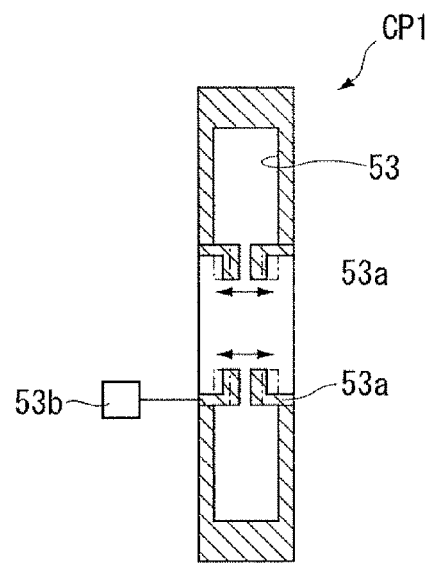
FIG. 20 is a view showing a constitution of an inner cup.

As the inlet of the accommodation portion 53, the facing portion 53a of the inner cup CP1 facing the side portion of the substrate S is separably mounted to other portions of the inner cup CP1. As shown in FIG. 20, the inner cup CP1 includes the adjusting mechanism 53b which adjusts the dimension of the opening of the facing portion 53a. For example, it is possible to adjust the dimension of the opening by using the adjusting mechanism 53b in accordance with the thickness of the substrate S or the bouncing state of the coating liquid. As shown in FIG. 17, the inner cup CP 1 is provided with the rotary mechanism (second rotary mechanism) 53c which rotates the inner cup CP1 about the X axis serving as the rotary axis in a direction along the outer periphery of the substrate S. The −Y-direction-side portion of the nozzle 52 is provided with the cleaning liquid nozzle portion 56 which ejects the cleaning liquid of the cup portion CP to the substrate S.

Figure 21:
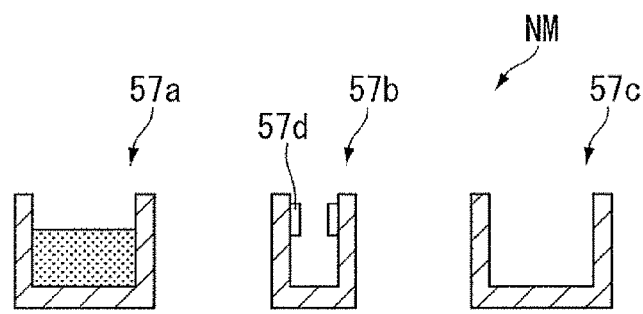
FIG. 21 is a view showing a constitution of a nozzle managing mechanism.

The nozzle managing mechanism NM manages the nozzle 52 so that the ejecting state thereof is uniform. As shown in FIG. 21, the nozzle managing mechanism NM includes the cleaning portion 57a, the suction portion 57b, and the liquid receiving portion 57c. The cleaning portion 57a cleans the front end of the nozzle 52 by dipping the front end in the solution. The suction portion 57b includes the suction pads 57d which suction the front end of the nozzle 52. The suction pads 57d are connected to a suction pump (not shown) or the like. The liquid receiving portion 57c is a portion which receives the liquid material preliminarily ejected from the nozzle 52.

Figure 22:
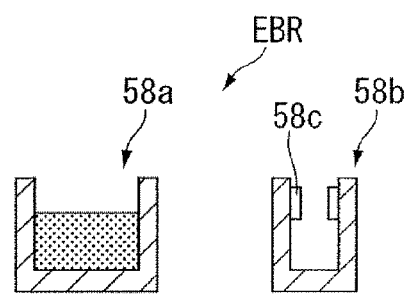
FIG. 22 is a view showing a constitution of a peripheral edge removing mechanism.

The peripheral edge removing device EBR is provided at a position along the −Y-direction-side edge of the substrate processing unit SPU on the +X direction side of the coating device CT. The peripheral edge removing device EBR is a device which removes the thin film formed on the peripheral edge of the substrate S. It is desirable that the removing process using the peripheral edge removing device EBR is performed in the state where the thin film formed on the substrate S is not dried. For this reason, it is desirable that the peripheral edge removing device EBR is disposed at a position capable of carrying the substrate S from the coating device CT in a short time. As shown in FIG. 22, the peripheral edge removing device EBR includes the removing portion 58a and the suction portion 58b. The removing portion 58a is, for example, a portion which removes the thin film formed on the peripheral edge of the substrate S in such a manner that the peripheral edge of the substrate S is dipped in the solution by rotating the substrate S so as to melt and remove the thin film formed on the peripheral edge of the substrate S. The suction portion 58b includes the suction pads 58c which suction the peripheral edge of the substrate S. The suction pads 58c are connected to a suction pump (not shown) or the like.

In the method of rotating the substrate S in FIG. 16, for example, the substrate processing unit SPU inserts the substrate S held by the holding portion 32 of the loading carrying device SC1 into the cup portion CP, and allows the holding portion 42 of the unloading carrying device SC2 to press the substrate S from the opposite side of the holding portion 32. In more detail, the front end of the holding portion 42 is allowed to move to the substrate S. The substrate processing unit SPU determines that the front end of the holding portion 42 contacts with the substrate S when the stroke of the holding portion 42 is equal to a predetermined threshold value.

After this determination, the substrate processing unit SPU cancels the operation absorbing the substrate S using the holding portion 32 in the state where the pressing force applied from the holding portion 42 is maintained. After the absorbing operation is canceled, the substrate processing unit SPU inserts the nozzle 52 into the cup portion CP, and starts the coating operation by rotating the substrate S. As seen above, the absorbing operation using the holding portion 32 may be canceled before rotating the substrate S.

In addition, after the determination, the substrate processing unit SPU allows the holding portion 32 to suction the substrate S and applies the rotation force to the substrate S in the state where the substrate S is pressed by the holding portion 42. After the rotation of the substrate S is changed from the accelerated rotation to the normal rotation, the substrate processing unit SPU cancels the operation of absorbing the substrate S using the holding portion 32. As seen above, the absorbing operation using the holding portion 32 may be canceled during the rotation of the substrate S.

In addition, after the determination, the substrate processing unit SPU rotates the holding portions 32 and 42 in the state where the substrate S is absorbed by the holding portion 32, and starts the coating operation. After the coating operation ends, the substrate processing unit SPU cancels the operation of absorbing the substrate S using the holding portion 32 in the state where the substrate S rotates. After the absorbing operation is canceled, the substrate processing unit SPU performs the rotation of the substrate S for a predetermined amount of time. As seen above, after the coating operation ends, the absorbing operation using the holding portion 32 may be canceled while the substrate S rotates.

In these cases, the substrate S is absorbed by the holding portion 32 of the loading carrying device SC1 and the substrate S is pressed by the holding portion 42 of the unloading carrying device SC2, but the invention is not limited thereto. For example, the substrate S may be pressed by the holding portion 32 of the loading carrying device SC1 and the substrate S may be absorbed by the holding portion 42 of the unloading carrying device SC2. Further, both surfaces of the substrate S may be absorbed or pressed by the holding portion 32 of the loading carrying device SC1 and the holding portion 42 of the unloading carrying device SC2. Furthermore, in the case where the substrate S is held by the second holding portion 81 shown in FIG. 14 or the rotary holding portion 82 shown in FIG. 15, the substrate S may be rotated by using the above-described method.

In addition, in these cases, upon rotating the substrate S, one of or both the loading carrying device SC1 and the unloading carrying device SC2 may be driven. In the case where both the loading carrying device SC1 and the unloading carrying device SC2 are driven in a synchronized manner, since the substrate S is resistant to slip on the holding portions 32 and 42, it is possible to reduce the pressing force applied to the substrate S.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A substrate processing system comprising:
    a processor which performs a predetermined process on a substrate;
    a first conveyor which supplies a loading container accommodating an unprocessed substrate and collects the loading container after said loading container is emptied;
    a second conveyor which supplies an unloading container to receive the processed substrate, when said unloading container is empty and collects an unloading container accommodating a processed substrate; and
    a carrier, configured to carry the loading container between a substrate loading unit and a loading position inside the processor and to carry the unloading container between a substrate unloading unit and an unloading position inside the processor,
    said substrate loading unit includes a first buffer which includes a plurality of second container standby portions corresponding to the loading position;
    said substrate unloading unit includes a second buffer which includes a plurality of second container standby portions corresponding to the unloading position, and a third moving mechanism which moves the plurality of second container standby portions in the same direction as the carrier,
    wherein the processor, the first conveyor, and the second conveyor are arranged in a linear direction,
    and said carrier travels on a rail in a linear direction between the first conveyor and the second conveyor, said carrier is configured to access the first buffer and second buffer, the substrate loading unit, the substrate unloading unit, said carrier includes a moving mechanism configured to move in a linear direction,
    wherein the processor, the first conveyor, the second conveyor and the carrier are structurally independent from each other,
    the loading container and the unloading container are structurally separated from each other and the loading container and the unloading container provided for each substrate are different,
    the first conveyor comprises a first supply belt which supplies the loading container accommodating the unprocessed substrate and a first collection belt which collects the loading container,
    the second conveyor comprises a second supply belt which supplies the unloading container and a second collection belt which collects the unloading container accommodating the processed substrate, and
    wherein the processor includes a coating device and a peripheral edge removing device, said coating device is configured to form a thin film on the substrate.

2. The substrate processing system according to claim 1, wherein the processor is disposed between the first conveyor and the second conveyor.

3. The substrate processing system according to claim 1, wherein the first conveyor and the second conveyor are respectively provided with a plurality of container standby portions.

4. The substrate processing system according to claim 3, wherein at least one of the first conveyor and second conveyor includes a second moving mechanism which moves the plurality of container standby portions.

5. The substrate processing system according to claim 4, wherein the second moving mechanism moves the container standby portions so that a supply target container moves closer to the carrier and a collection target container moves away from the carrier.

6. The substrate processing system according to claim 1, wherein the processor includes a pickup mechanism which lifts the substrate from the loading container and disposes the substrate at the loading position.

7. The substrate processing system according to claim 1, wherein the carrier includes a rotary mechanism which rotates the direction of the carrier.

8. The substrate processing system according to claim 1, wherein each of the loading container and the unloading container is provided with an engagement portion, and wherein the carrier includes a holder which engages with the engagement portion so as to hold the loading container or the unloading container.

9. The substrate processing system according to claim 1, further comprising:
    a controller which controls a carrying position of at least one of the loading container and the unloading container in accordance with a processing state of the substrate in the processor.

10. The substrate processing system according to claim 1, wherein the processor performs a coating process of coating a liquid material on the substrate, a pre-process of the coating process, and a post-process of the coating process.

11. The substrate processing system according to claim 10, wherein the pre-process includes at least one of a process of irradiating the substrate with an ultraviolet ray and a process of cleaning the substrate.

12. The substrate processing system according to claim 11, wherein the post-process includes at least one of a process of depressurizing the vicinity of the substrate and a process of heating the substrate.

13. The substrate processing system according to claim 1, further comprising:
a foreign material detector which detects a foreign material existing on the substrate subjected to the predetermined process.

* * * * *